(12) United States Patent
Meng et al.

(10) Patent No.: US 9,891,006 B2
(45) Date of Patent: Feb. 13, 2018

(54) METAL-BASED MICROCHANNEL HEAT EXCHANGERS MADE BY MOLDING REPLICATION AND ASSEMBLY

(71) Applicants: Wen Jin Meng, Baton Rouge, LA (US); Fanghua Mei, Camarillo, CA (US)

(72) Inventors: Wen Jin Meng, Baton Rouge, LA (US); Fanghua Mei, Camarillo, CA (US)

(73) Assignee: BOARD OF SUPERVISORS OF LOUISIANA STATE UNIVERSITY AND AGRICULTURAL AND MECHANICAL COLLEGE, Baton Rouge, LA (US)

(*) Notice: Subject to any disclaimer, the term of this patent is extended or adjusted under 35 U.S.C. 154(b) by 42 days.

(21) Appl. No.: 15/010,162

(22) Filed: Jan. 29, 2016

(65) Prior Publication Data

US 2016/0161195 A1   Jun. 9, 2016

Related U.S. Application Data

(62) Division of application No. 12/812,556, filed as application No. PCT/US2009/030834 on Jan. 13, 2009, now abandoned.

(Continued)

(51) Int. Cl.

| F28F 13/18 | (2006.01) |
|---|---|
| F28F 1/00 | (2006.01) |
| B81C 99/00 | (2010.01) |
| F28F 3/12 | (2006.01) |
| F28F 21/08 | (2006.01) |

(Continued)

(52) U.S. Cl.
CPC .......... *F28F 1/00* (2013.01); *B81C 99/0085* (2013.01); *F28F 3/12* (2013.01); *F28F 21/08* (2013.01); *H01L 21/4882* (2013.01); *H01L 23/3675* (2013.01); *H01L 23/473* (2013.01); *B81B 2201/058* (2013.01); *B81C 2203/038* (2013.01);
(Continued)

(58) Field of Classification Search
CPC ..... F28F 1/00; F28F 3/12; F28F 21/08; H01L 21/4882; H01L 23/3675; H01L 23/473
USPC ........................................................ 165/133
See application file for complete search history.

(56) References Cited

U.S. PATENT DOCUMENTS

| 5,176,205 A | 1/1993 | Anthony |
|---|---|---|
| 5,727,618 A | 3/1998 | Mundinger et al. |

(Continued)

OTHER PUBLICATIONS

Arias, F. et a6., "Fabrication of Metallic Heat Exchangers Using Sacrificial Polymer Mandrils," JMEMS vol. 10, p. 107 (2001).

(Continued)

*Primary Examiner* — Davis Hwu

(57) ABSTRACT

Compression molding of metals is used to make microchannel heat exchangers. Heat transfer can be improved by employing controlled microchannel surface roughness. Flux-free bonding is achieved using a eutectic thin-film intermediate layer. Seals are leak-tight, mechanically strong, and uniform across multiple contact areas. The metal heat exchangers may be mass-produced inexpensively, and are useful for applications including the cooling of computer chips and other high-power electronic devices, air conditioning, refrigeration, condenser plates, radiators, fuel cell heat management, and instant water heating.

20 Claims, 26 Drawing Sheets

Related U.S. Application Data

(60) Provisional application No. 61/020,789, filed on Jan. 14, 2008.

(51) Int. Cl.
 *H01L 21/48* (2006.01)
 *H01L 23/473* (2006.01)
 *H01L 23/367* (2006.01)

(52) U.S. Cl.
 CPC ... *F28F 2260/02* (2013.01); *H01L 2924/0002* (2013.01)

(56) References Cited

U.S. PATENT DOCUMENTS

| | | | |
|---|---|---|---|
| 6,903,929 B2 | 6/2005 | Prasher et al. | |
| 6,934,154 B2 | 8/2005 | Prasher et al. | |
| 7,114,361 B2 | 10/2006 | Meng | |
| 8,257,795 B2 * | 9/2012 | Lu | B22F 1/0059 419/8 |
| 2002/0011330 A1 * | 1/2002 | Insley | F28F 3/048 165/133 |
| 2004/0112585 A1 | 6/2004 | Goodson et al. | |
| 2004/0182548 A1 * | 9/2004 | Lovette | F28F 3/12 165/103 |
| 2005/0056074 A1 | 3/2005 | Meng | |
| 2006/0113063 A1 | 6/2006 | Chordia et al. | |
| 2006/0142401 A1 | 6/2006 | Tonkovich et al. | |
| 2006/0157234 A1 | 7/2006 | Golecki | |
| 2006/0283580 A1 | 12/2006 | Usui | |

OTHER PUBLICATIONS

Cao, D. et al., "Amorphous hydrocarbon based thin films for high-aspect-ratio MEMS applications," Thin Solid Films, 398-399 (2001) 553-559 (2001).

Cao, D. et al., "Conformal deposition of Ti-C:H coatings over high-aspect-ratio micro-scale structures and tribological characteristics," Thin Solid Films, vol. 429, pp. 46-54 (2003).

Cao, D. et al., "Microscale compression molding of Al with surface engineered LiGA inserts," Microsyst Techno/., vol. 10, pp. 662-670 (2004).

Jiang, J. et al., "Further experiments and modeling for microscale compression molding of metals at elevated temperatures," J. Mater. Res., vol. 22, pp. 1839-1848 (2007).

Lee, P. et al., "Investigation of heat transfer in rectangular microchannels," Int. J. Heat Mass Transf., vol. 48, No. 9, pp. 1688-1704 (2005).

Mei, F. et al., "Eutectic bonding of Al-based high aspect ratio microscale structures," Microsyst Techno/. vol. 13 pp. 723-730 (published online Jan. 16, 2007).

Mei, F. et al., "Evaluation of bond quality and heat transfer of Cu-based microchannel heat exchange devices, ," J Vac Sci Technol A, vol. 26, No. 4, pp. 798-804 (published online Jun. 30, 2008).

Mei, F. et al., Evaluation of eutectic bond strength and assembly of Al-based microfluidic structures, Microsyst Technol., vol. 14, pp. 99-107 (published online Apr. 3, 2007).

Mei, F. et al. Fabrication, assembly, and testing of Cu- and Al-based microchannel heat exchangers, J. Microelectromechanical Systems, vol. 17, No. 4, pp. 869-881 (published online Jun. 27, 2008).

Meng, W. et al., "Stresses during micromolding of metals at elevated temperatures: pilot experiments and a simple model," J. Mater. Res., vol. 20, pp. 161-175 (2005).

Tiensuu, A. et al., "Assembling three-dimensional microstructures using gold-silicon eutectic bonding," Sensor Actuat A, vol. 45, pp. 227-236 (1994).

Tuckerman, D. et al. "High performance heat sinking for VLSI," IEEE Elect. Dev. Lett., vol. 2, pp. 126-129 (1981).

Vu, B. et al., "Patterned eutectic bonding with Al/Ge thin films for microelectromechanical systems," J Vac Sci Technol B, vol. 14, No. 4, pp. 2588-2594 (1996).

* cited by examiner

METAL-BASED MICROCHANNEL HEAT EXCHANGERS MADE BY MOLDING REPLICATION AND ASSEMBLY

CROSS REFERENCE TO RELATED APPLICATIONS

This is a divisional application of U.S. patent application Ser. No. 12/812,556, filed on Aug. 3, 2010, which is hereby incorporated by reference in its entirety and which is the United States 371 national stage filing of international application PCT/US2009/030834, having an international filing date of Jan. 13, 2009, which claims the benefit of the Jan. 14, 2008 filing date of U.S. provisional patent application 61/020,789 under 35 U.S.C. § 119(e).

STATEMENT REGARDING FEDERALLY SPONSORED RESEARCH OR DEVELOPMENT

This invention was made with government support under agreement CMMI-0556100 awarded by the National Science Foundation. The Government has certain rights in the invention.

TECHNICAL FIELD

This invention pertains to microscale structures made by compression molding of high melting-temperature metals, particularly to metal-based microchannel heat exchangers.

BACKGROUND ART

The nearly exponential growth in the heat generated by miniaturized electronic devices in recent years demands significant improvements in cooling technology. Existing fan-assisted air cooling methods will be insufficient for the next generation of microprocessors. Only liquid-cooled heat exchangers will be able to absorb and dissipate heat rapidly enough to maintain safe microprocessor operating temperatures. A stringent requirement of high efficiency is imposed on such a heat exchanger. The cooling system must be small and must be a closed loop, so that it may: a) fit within a desktop or laptop computer; and b) not require external cooling water.

Microchannel Heat Exchangers

Decreasing the liquid cooling channel dimensions to the micron scale in a solid-liquid heat exchanger leads to high heat transfer rates. Convective heat transfer from the channel surface to water is fast, but diffusional heat transfer from the liquid at the interface to liquid in bulk is slow. By reducing the liquid cooling channel dimensions, the interface area-to-bulk volume ratio increases, thereby reducing rate-limiting diffusional heat transport.

There have been prior demonstrations of high solid-fluid heat transfer from microchannels, primarily in silicon-based microchannel heat exchangers. The use of silicon in such devices in these studies was not so much because silicon has desirable heat transfer properties, but rather because fabrication techniques for Si-based, high-aspect-ratio microscale structures (HARMS) are relatively mature and widely available. Indeed, Si possesses a substantially lower bulk thermal conductivity than that of the metals that would otherwise be preferred in larger-scale heat exchangers, such as Cu and Al. Further, Si is relatively brittle, and consequently Si-based devices tend to be fragile and easily damaged.

Si microfabrication techniques typically involve a photolithography process in which a uniform, polymerizable resist layer is deposited onto a Si substrate, and a desired pattern is photoexposed into the resist layer. Unpolymerized resist is removed chemically or by solvation, and the Si substrate is etched through the developed resist pattern either by wet chemical etching (WCE) or reactive ion etching (RIE). Additional deposition and etching of thin metal films may be required for the RIE process. Photolithography and etching are required for each Si microscale device, and to enjoy an economy of scale, a substantial investment in large clean room and thin film deposition facilities is required.

Microchannel heat exchangers have also been fabricated in materials other than Si by the LiGA process. LiGA combines deep X-ray/UV lithography (Lithographie) of a polymeric resist, followed by metal electrodeposition (Galvanoformung) into the developed resist recesses to form durable, primary HARMS. Replication of secondary HARMS from the primary HARMS via molding (Abformung) then follows. For example, U.S. Pat. No. 6,415,860 discloses Ni electrodeposition to make microscale Ni mold inserts that are then used to mold microchannel heat exchangers in polymethylmethacrylate (PMMA). Metal-based crossflow heat exchangers, such as those made from NiP alloys, were also made, by an additional electroless deposition onto LiGA-fabricated polymer templates. F. Arias et al., "Fabrication of metallic heat exchangers using sacrificial polymer mandrils," JMEMS vol. 10, p. 107 (2001) reported the fabrication of Ni-based heat exchangers by electrodeposition of nickel onto sacrificial polymer mandrels.

There are unfilled needs in existing heat exchangers. For example, the thermal conductivity of PMMA is poor, and PMMA-based microchannel heat exchangers cannot endure temperatures higher than about 100° C. While Ni-based and NiP-based heat exchangers can function at higher temperatures, their heat conductivities are still less than optimal. Furthermore, the electrode-based and electroless deposition techniques used to make them are slow, and require close monitoring and control. Their cost of fabrication is high and is expected to remain high because of the extra deposition steps involved in these "lost-mold" processes.

Existing Si microfabrication techniques do not work for making metal-based microstructures. For example, the structural and chemical isotropy of polycrystalline metals leads to removing material in a somewhat isotropic manner in a WCE process, broadening features from those defined lithographically. RIE techniques are also inappropriate for metallic substrates. Because metal-based microchannel devices are highly desirable for heat transfer applications, there is an unfilled need for improved fabrication techniques to mass-produce metal-based microchannel devices rapidly and inexpensively.

Microchannel Fabrication by Compression Molding

Microscale compression molding, or hot embossing, of polymeric plastic materials is an established technique. First, a primary HARMS mold insert is produced, typically through a sequence of lithography, etching, deposition steps, with optional additional steps. Second, the mold insert is impressed into a substrate, and polymer fills voids in the mold insert through viscous or plastic flow to form the negative of the insert pattern. A large number of negative HARMS replicas can be reproduced from a single primary HARMS. In principle, under favorable conditions one primary mold insert may be used to produce hundreds or even thousands of replicas rapidly and at low cost.

The quality of the replica depends upon, among other factors, the mechanical yield strength of the mold insert at elevated molding temperatures. An important problem confronting compression metal microstructure molding is the lack of microstructure mold insert materials that retain high mechanical yield strengths at the molding temperatures required for metals. An electrodeposited Ni mold insert, for example, suffers permanent shape deformation when used to mold a higher-melting temperature metal, such as Cu.

Another problem can arise from chemical reactivity between the mold insert and the metal substrate. During compression, chemical bonds can form between the insert and the substrate. These bonds can cause the insert to break and can damage the molded structure as it is withdrawn from the substrate. These surface chemistry problems had restricted the metals that could be used as mold inserts and as substrates, until the development of a conformal ceramic surface coating to inhibit chemical bond formation. Using ceramic conformal coatings, secondary HARMS have been successfully reproduced in previously problematic, chemically reactive metals, such as Zn and Al, with LiGA-fabricated Ni mold inserts. See generally D. Cao et al., "Amorphous hydrocarbon based thin films for high-aspect-ratio MEMS applications," *Thin Solid Films* 398-399 (2001) 553-559; and D. Cao et al., "Conformal deposition of Ti—C:H coatings over high-aspect-ratio microscale structures and tribological characteristics," *Thin Solid Films* 429 (2003) 46-54.

Bonding the Cover Plate

Once a microchannel has been fabricated in a substrate, whether Si or metal, a leak-tight cover plate must be affixed before it can be used as a practical heat exchanger. Several bonding methods have been reported for Si-based microsystems, including anodic bonding and direct bonding. However, these techniques are not well-suited for bonding metal-based HARMS.

Eutectic Bonding

Braze-bonding of bulk metal pieces has previously been used in different applications. Brazing is a joining process in which a non-ferrous filler metal or alloy is heated to its melting temperature and distributed between two (or more) close-fitting metal parts by capillary action. The filler metal can optionally be a eutectic mixture. A "eutectic" mixture is a mixture whose proportions are such that the melting point is as low as possible; and such that the constituents of the mixture all crystallize simultaneously at this temperature from molten liquid solution, a temperature that is called the eutectic point. For example, it has been reported that thin films of Si, Si—Al, and Zn—Al have been deposited onto bulk Al pieces by electron beam evaporation or sputtering. These Al pieces were then braze-bonded to one another by heating to 578-595° C., with flux introduced to remove surface aluminum oxides. This technique would be unsuitable for use with microchannels, however, because flux residue would tend to block the microchannels.

D. Tuckerman et al., "High performance heat sinking for VLSI," *IEEE Elect. Dev. Lett.* 2, 126-129 (1981) discloses a water-cooled, integral heat sink fabricated in silicon with a Pyrex cover plate.

A. Tiensuu et al., "Assembling three-dimensional microstructures using gold-silicon eutectic bonding," *Sensor Actuat A* 45, 227-236 (1994) discloses the use of gold-silicon eutectic bonding to join silicon microelements to one another.

B. Vu et al., "Patterned eutectic bonding with Al/Ge thin films for microelectromechanical systems," *J Vac Sci Technol B* 14(4):2588-2594 (1996) discloses the use of an aluminum/germanium eutectic to bond silicon dice to one another.

P. Lee et al., "Investigation of heat transfer in rectangular microchannels," *Int. J. Heat Mass Transf.*, vol. 48, no. 9, pp. 1688-1704 (2005) discloses measurements and numerical modeling of heat transfer in rectangular microchannels. Test pieces were made of copper, with ten microchannels in parallel, and a polymeric cover plate.

D. Cao et al., "Microscale compression molding of Al with surface engineered LiGA inserts," *Microsyst Technol.* 10 (2004) 662-670 discloses the use of high-temperature compression molding of aluminum plates with high-aspect ratio microscale mold inserts made of nickel conformally coated with a titanium-containing hydrocarbon. See also W. Meng et al., "Stresses during micromolding of metals at elevated temperatures: pilot experiments and a simple model," *J. Mater. Res.* 20 (2005) 161-175; J. Jiang et al., "Further experiments and modeling for microscale compression molding of metals at elevated temperatures," *J. Mater. Res.* 22 (2007) 1839-1848; U.S. Pat. No. 7,114,361; and U.S. published patent application 2005/0056074.

F. Mei et al., "Eutectic bonding of Al-based high aspect ratio microscale structures," *Microsyst Technol.* 13: 723-730 (published online 16 Jan. 2007) reports work from our research group concerning the eutectic bonding of Al-based high aspect ratio microscale structures with Al—Ge intermediate layers. See also F. Mei et al., "Evaluation of eutectic bond strength and assembly of Al-based microfluidic structures, *Microsyst Technol.* 14: 99-107 (published online 3 Apr. 2007); F. Mei et al., "Fabrication, assembly, and testing of Cu- and Al-based microchannel heat exchangers, *J. Microelectromechanical Systems* 17(4): 869-881 (published online Jun. 27, 2008); and F. Mei et al., "Evaluation of bond quality and heat transfer of Cu-based microchannel heat exchange devices," *J Vac Sci Technol A* 26(4):798-804 (published online Jun. 30, 2008).

U.S. Patent Application 2006/0142401 discloses the use of partial boiling in a minichannel or microchannel to remove heat from an exothermic process. Surface roughness was said to enhance nucleation for boiling. See, e.g., Example 11.

U.S. Patent Application 2006/0157234 discloses a microchannel heat exchanger, and briefly mentions surface roughness.

U.S. Pat. No. 5,727,618 discloses a modular microchannel heat exchanger formed from a stack of multiple thin copper sheets etched with rows of elongated holes, coated with silver and held together with the holes aligned, e.g. with pins. The stack is heated, and the copper and silver form a fused or eutectic alloy brazing the sheets together. The holes through the multiple sheets then form a microchannel.

SUMMARY OF THE INVENTION

We have discovered novel metal-based microscale structures, and methods of making those microstructures, including but not limited to structures that incorporate microchannels. The preferred manufacturing method employs compression molding of high melting-temperature metals, for example copper, copper-based alloys, aluminum, and other metals. Molding replication of such metals requires mold inserts with high yield strengths at elevated molding temperatures. We have developed a process to fabricate mold inserts made of refractory metals that possess heretofore unattainable microscale detail.

Another aspect of the invention is the joining of microscale structures made of similar or dissimilar metals via a bonding process involving thin film eutectic or near-eutectic mixtures comprising micro- or nano-domains that are substantially smaller than the contact areas of the microstructures to be joined.

Another aspect of the invention is the connection of compression-molded metal microchannels, substantially free of obstructions, to larger channels/plena for fluidic connection to tubes, pipes, valves and other external fluidic elements, where the external elements typically (but not necessarily) have larger dimensions than the microchannels.

Yet another aspect of the invention is the modulation of microchannel wall roughness. Enhanced wall roughness is a consequence of the preferred manufacturing methods disclosed here, but does not generally result from other microchannel fabrication methods. The enhanced roughness causes a surprising and significant enhancement in heat transfer from the microchannel surface to a fluid flowing through it. Without wishing to be bound by this hypothesis, we believe that the improved heat transfer is a consequence of hydrodynamic effects induced by the microchannel surface roughness.

We have developed improved methods for bonding metal microchannel plates to plain metal plates, other metal microchannel plates, or other metal structures. Flux-free bonding is achieved using a eutectic thin-film intermediate layer. The novel technique produces seals that are leak-tight, mechanically strong, and uniform across multiple microscale contact areas. The thin film intermediate layers are fabricated, for example, by vapor phase deposition onto the metallic HARMS or other metallic layers to be bonded, such as by physical or chemical vapor deposition. An alternate method is to sandwich free-standing thin films of metals or alloys between the metallic HARMS or other metallic layers to be bonded. Metal heat exchangers in accordance with the present invention may be mass-produced inexpensively, and are useful for numerous applications, including for example the cooling of computer chips and other high-power electronic devices, air conditioning, refrigeration, condenser plates, radiators, fuel cell heat management, and instant water heating. The heat exchangers are capable of handling high internal pressures, e.g. 100, 200 or 300 atmospheres or even higher. Because they are made of metal, they are better able to withstand external mechanical stress and shock than devices made from silica or from polymers. They can have a very low-profile construction; for example, the distance between the heat source and the fluid medium may be as small as 500 µm or even closer.

Using the novel technique, it is not necessary to use a large number of thin layers to build up microchannels. Rather, the microchannels may be formed from only two metal layers, either or both of which can include open channels prior to their bonding together; and an intermediate layer of eutectic or eutectic precursor to braze the two metal layers to one another. The open channels in the metal layer or layers are preferably formed by molding, but may also be formed by techniques otherwise known in the art, such as milling. Depending on the geometry of the particular device, precise alignment between the two metal layers can sometimes be important, while in other instances such precise alignment may not be needed (for example, if all open channels are in one of the two metal pieces, and if the second piece acts as a cover plate to convert the open channels into closed channels).

MODES FOR CARRYING OUT THE INVENTION

Microchannel Fluid Flow

Figure 1:
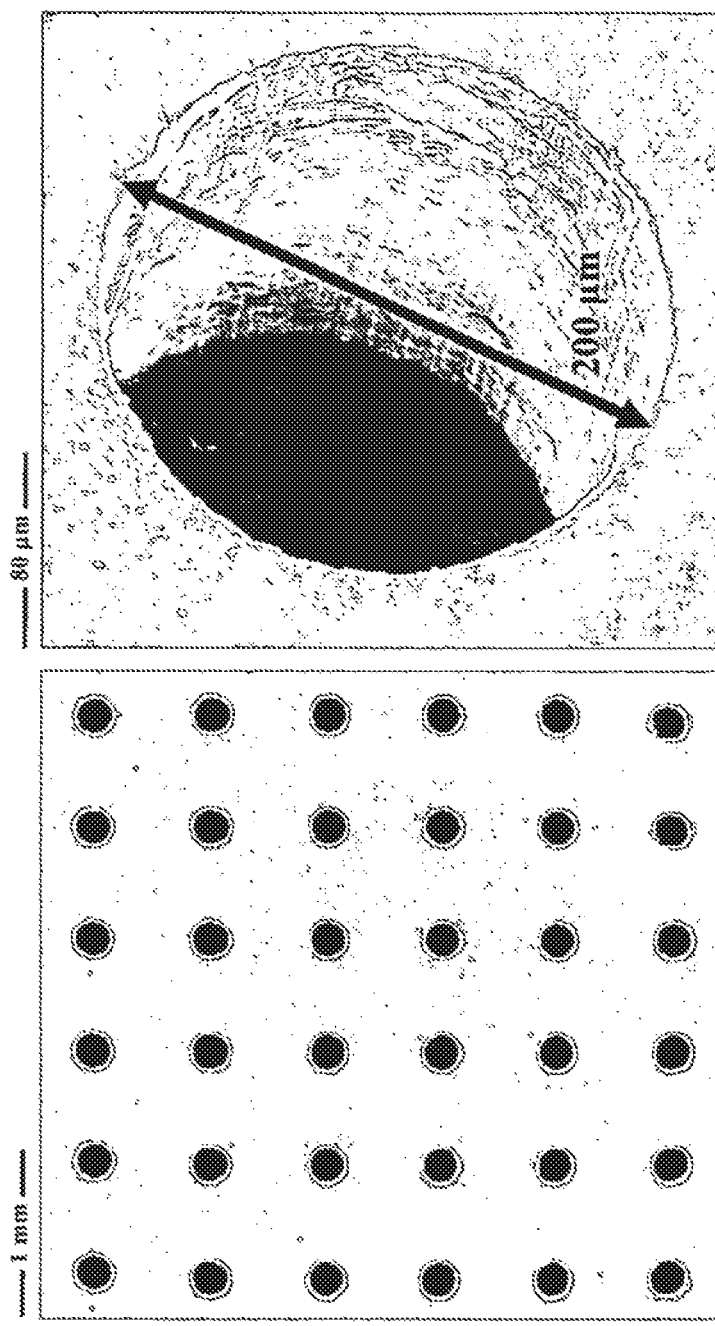
FIGS. 1(a) and 1(b) depict SEM micrographs of an example of Al molding replication, and the typical submicron sidewall roughness in the replicated Al HARMS.

X-ray/UV lithography LiGA processes can produce very smooth sidewalls in the developed polymeric resist recesses, and the high fidelity of electrodeposition and molding processes conveys this smoothness to the molded metal. FIG. 1 depicts an example of Al molding replication and the typical sub-micron sidewall roughness in the replicated Al HARMS. The novel methods allow one to control surface roughness, in particular to increase surface roughness, as compared to the surface smoothness that is more typically achieved by the LiGA process. We have discovered that, surprisingly, modulation of surface roughness can produce significant improvements in microchannel heat exchange.

Microchannel cover plate bonding should satisfy several requirements. First, bonding across the mating surfaces for each individual microchannel should be complete to prevent cross-communication between different microchannels. Second, because microchannels generally have high internal flow resistance, they will often require significant driving pressures, which in turn means that bond strengths should be high. Finally, to reduce the likelihood of microchannel deformation a relatively low bonding temperature is desirable, a temperature that depends on the melting temperature of the particular metal. For example, with an aluminum-based device, a bonding temperature lower than about 578-595° C. is desirable, since the melting temperature of aluminum is 660° C. (or 933° K).

Fabrication of Metal-Based Microchannels by Compression Molding

One aspect of the invention pertains to compression molding of metal-based microchannels. In a preferred embodiment, mold inserts are fabricated from a refractory metal or alloy, for example Ta or the superalloy Inconel X750® (a nickel-chromium-iron alloy, with additions of aluminum, titanium, and niobium). The insert may be fabricated, for example, by using micro electrical discharge machining (μEDM) to create microscale recesses in a refractory metal or alloy, followed by electrochemical polishing (ECP) to remove surface layers damaged during μEDM. Next is an optional, but preferred conformal deposition of a bond-inhibitor coating, for example as described in U.S. Pat. No. 7,114,361, using, for example, a ceramic or ceramic mixture coating, such as amorphous carbon or silicon nitride. The coated, refractory metal mold inserts may then be used to make HARMS in a softer metal, such as Cu or Ni, by molding replication with little or no apparent damage to the mold inserts.

Significant cost benefits are achieved when a refractory mold insert can be used to produce a large number of metal replicas. We have found that various refractory metals, including for example Ta, W, Mo; refractory alloys such as Ni-based superalloys and Fe-based tool steels; and engineering ceramics such as transition metal carbides and transition metal nitrides, possess sufficient mechanical yield strengths to repeatedly produce high-fidelity replicas without substantial damage or degradation. Because these refractory metals and alloys cannot conveniently be electrodeposited using known techniques, we developed a μEDM/ECP process to fabricate mold inserts with intricate, microscale features.

Specifically, we have used μEDM to create microscale trenches in refractory metals and alloys, thereby achieving desired mold insert geometries. The μEDM process is preferably followed by ECP to remove surface damage from the μEDM step. Importantly, control of ECP operating parameters allows one not only to minimize surface roughness, but to also impart roughness to the mold insert surfaces when desired. We have found that a conformal coating deposition following ECP, which is used to prevent chemical reactions and bonding between the mold insert and the molded metals, generally does not substantially change the mold insert's surface roughness. Control of the ECP parameters allows one to impart surface roughness on the order of tens of microns, measured as the mean peak-to-valley roughness Rz. The microchannel surface roughness is significant. We unexpectedly discovered that increased surface roughness can substantially enhance the exchange of heat from the microchannel wall to fluid flowing through the microchannel.

In one embodiment, μEDM combined with LiGA-fabricated electrodes, ECP, and conformal coating deposition can be used to create mold inserts with complex geometries, such as branched, serpentine, or meandering microchannels, and microchannels with asymmetric cross-sections, unequal depths, and other arbitrary profiles.

Figure 2:
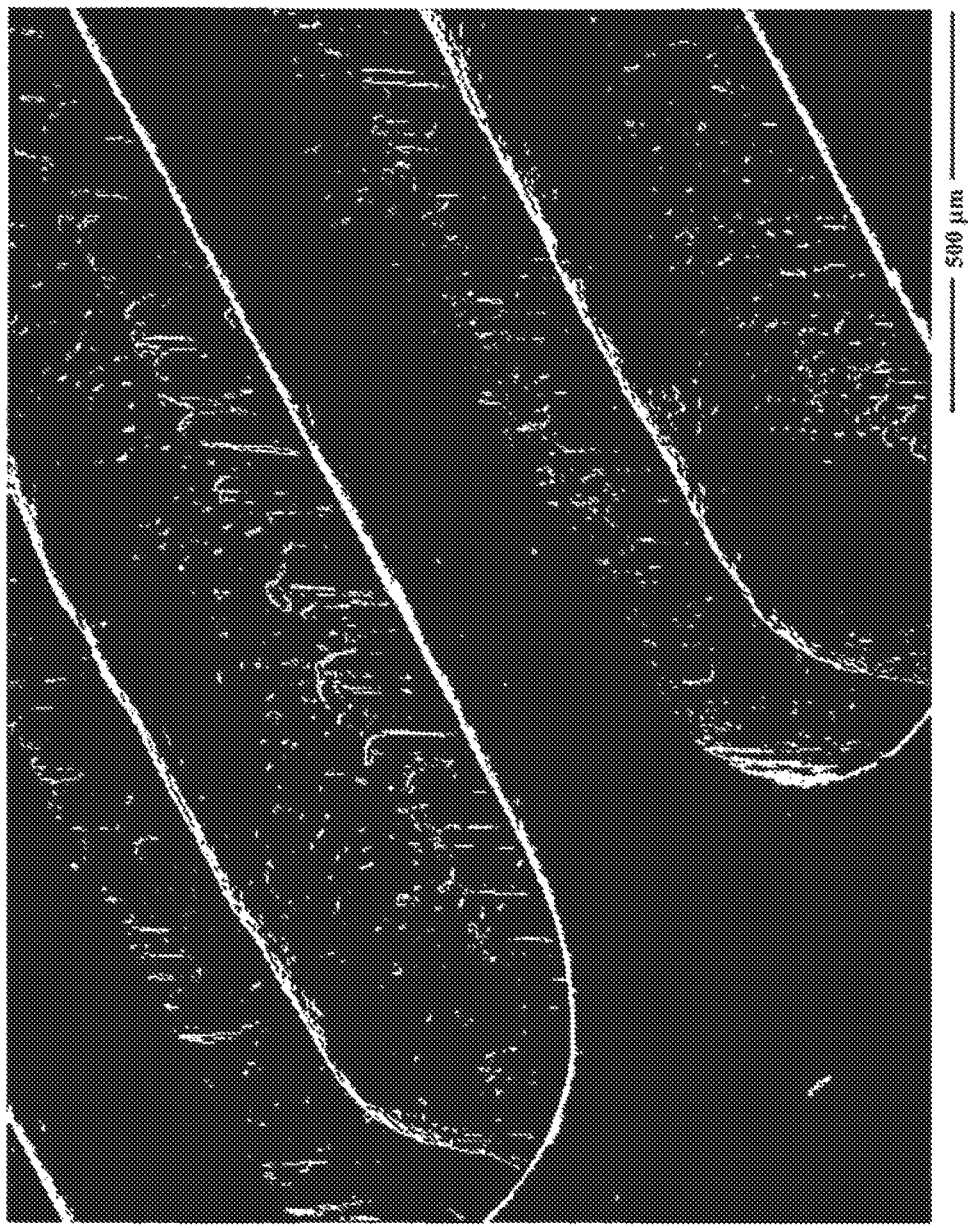
FIG. 2 depicts an SEM high magnification view of one section of a molded microchannel in Al, showing elevated surface roughness on the microchannel sidewalls.

Because the molding replication process faithfully reproduces a negative of the mold insert onto the molded metals, the resulting microchannels have a surface roughness similar to that of the mold insert. FIG. 2 depicts a portion of a single meandering microchannel in Al, created by replication from a Ta mold insert that was fabricated by μEDM and ECP, followed by a conformal coating with Ti-containing, amorphous, hydrogenated carbon. In contrast to the smooth surfaces of the LiGA-fabricated Ni inserts, as shown in FIG. 1, the microchannel roughness depicted in FIG. 2 was five microns or higher, reflecting that of the Ta insert.

Example 1: Insert Fabrication

Microscale mold inserts were fabricated in Ni-based superalloy Inconel X750® plates in three steps: 1) μEDM of the active area; 2) electrochemical polishing (ECP) of the machined microscale Inconel features; and 3) deposition of a conformal, amorphous silicon nitride (a-Si:N) coating over the electrochemically polished microscale features. As-received Inconel plates were machined to square insert blanks, with an active area of ~15000 μm×~15000 μm, ~3200 μm in height. The top surface of the blank was mechanically polished with SiC abrasive papers down to 1200 grit size. A SARIX high precision micro erosion machine, model SR-HPM-B, was used for insert μEDM. Flat molybdenum (Mo) sheets with a thickness of 500 μm were used as blade electrodes. A series of parallel cuts was made on the insert blank. Erosion of the insert blank by μEDM produced a trench under the Mo electrode. Sequential cuts led to the formation of an array of trenches, or an array of parallel rectangular microprotrusions between trenches. As-machined Inconel blanks were electrochemically polished for 10 min in "current-controlled" mode in a mixed acid solution of $HClO_4$ (70%) and $CH_3COOH$ (80%) at a volume ratio of 1:1. Following ECP, a conformal a-Si:N coating was deposited over the Inconel inserts in a radio frequency (rf), inductively coupled plasma (ICP)-assisted, hybrid chemical/physical vapor deposition system, generally following the procedures of W. J. Meng et al., "Temperature dependence of inductively coupled plasma assisted deposition of titanium nitride coatings," Surf. Coat. Technol. 120/121, 206 (1999).

Figure 3:
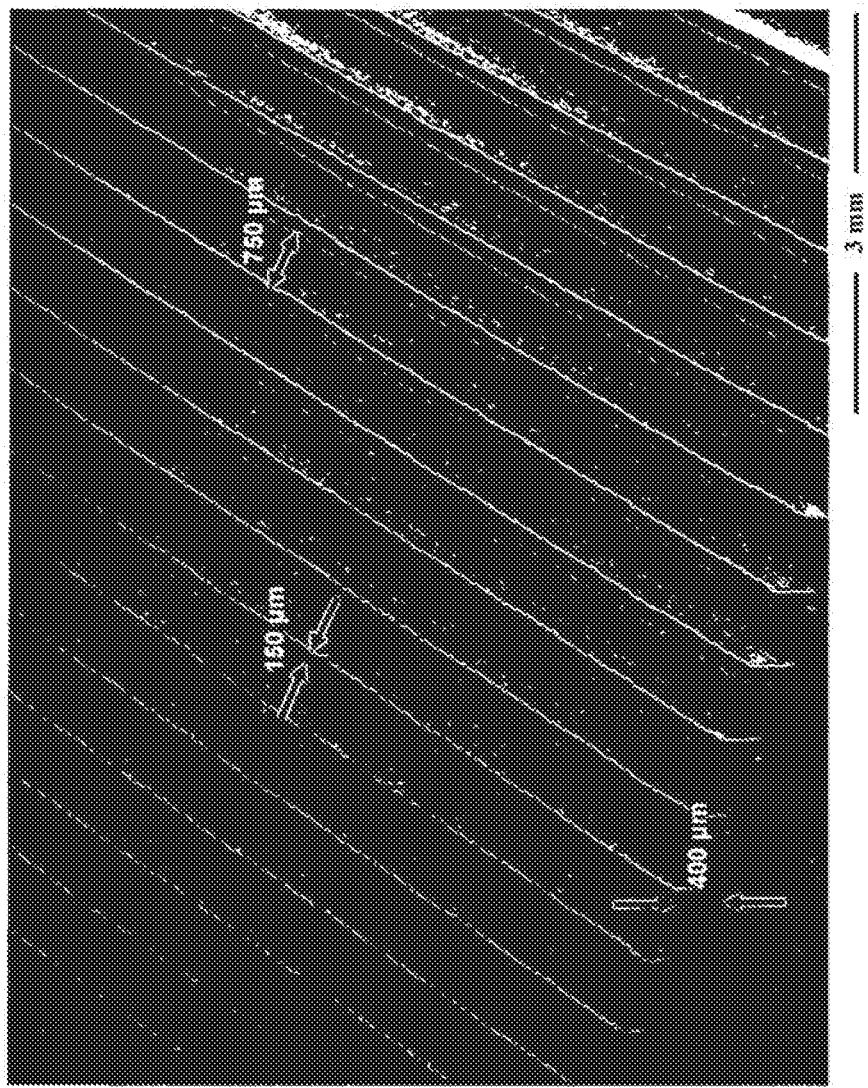
FIG. 3 depicts an SEM micrograph of an amorphous silicon nitride-coated Inconel mold insert.
Figure 4:
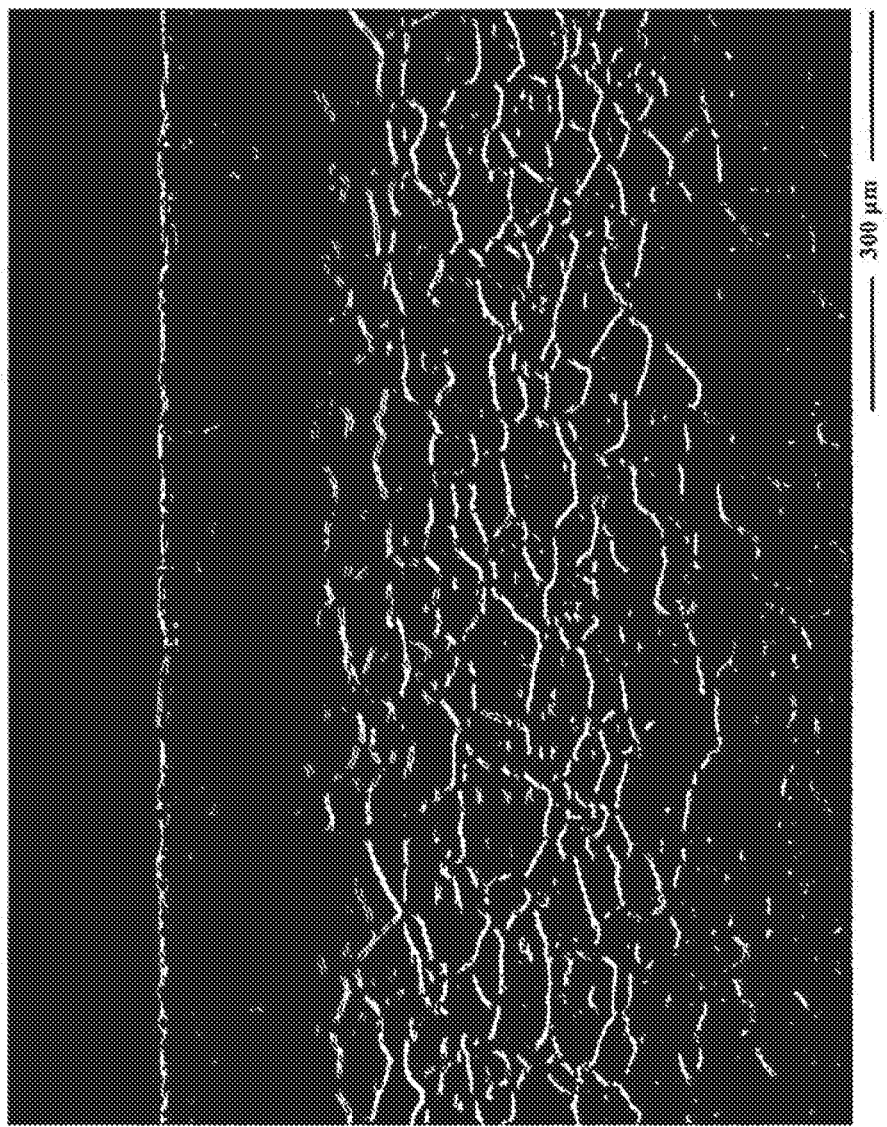
FIG. 4 depicts a high magnification SEM micrograph of an amorphous silicon nitride coated Inconel mold insert, showing a typical rectangular microprotrusion.

Surface morphology was examined both with a Hitachi S3600N scanning electron microscope (SEM), and with a Veeco Wyko3100 optical profilometer (OP). An SEM overview of one a-Si:N coated Inconel insert is shown in FIG. 3. The thickness of the a-Si:N coating was ~600 nm. The insert contained 19 parallel rectangular microprotrusions, with center-to-center spacings of ~750 μm. The sequential cutting process led to variations in the widths of the microprotrusions. The average width of all microprotrusions, as measured from the SEM micrographs, was 154 μm. The trench bottoms were somewhat rounded. The height of the straight section of the microprotrusions was ~400 μm. FIG. 4 depicts a close-up SEM image of a typical microprotrusion. The numerous micron-scale features on the microprotrusion surface resulted from preferential etching during the ECP process, probably delineated by the grain structure of the underlying Inconel substrate. The a-Si:N coating presumably adheres to the substrate morphology conformally without significantly modifying it.

Examples 2 and 3: Microchannel Compression Molding in Cu and Al Using Refractory Mold Inserts with Enhanced Surface Roughness Cu 110 (99.9+ wt. % Cu) and Al 6061 (1.0 wt. % Mg, 0.6 wt. % Si, 0.27 wt. % Cu, 0.2 wt. % Cr, balance Al) coupons, with the same geometry of 35.5 mm×35.5 mm×6.4 mm, were molded at high temperatures with the a-Si:N coated Inconel insert shown in FIGS. 3 and 4. Before molding, the top surfaces of the Cu and Al coupons were mechanically polished with SiC abrasive papers of different sizes and finished with a 1 μm diamond particle suspension. Compression molding was carried out in a MTS858 single-axis testing system interfaced to a high-vacuum molding chamber, which housed two heating stations. One heating station was mechanically attached to the bottom of the vacuum chamber. A second heating station was mechanically attached to the top linear actuator of the MTS858 testing system through a bellow-sealed motion feed-through. The two heating stations were heated separately by resistive heating cartridges, and temperatures were monitored by two separate K-type thermocouples. The coupon to be molded was fastened to the top surface of the bottom heating station, while the insert was mechanically attached to the bottom surface of the top heating station, which in turn was attached to the linear actuator. Total axial force and axial displacement of the insert were measured continuously during the entire molding and demolding process. Molding of Cu coupons occurred with both the coupon and the insert heated to ~500° C., while molding of Al coupons occurred with both the coupon and the insert heated to ~400° C. The molding process faithfully replicated the array of 19 parallel rectangular microprotrusions into parallel rectangular microchannels in both the Cu and the Al coupons. The average width of microchannels on the Cu coupon was measured as 150 μm. The average width of microchannels on the Al coupon was measured as 148 μm. The final width of the molded microchannel tended to be somewhat smaller than that of the corresponding microprotrusion on the mold insert, by ~3% for Cu, and ~4% for Al. The depths of the molded microchannels were greater than 400 μm.

Optical profilometry (OP) images from the bottoms of replicated Cu microchannels were used to assess the surface roughness within molded microchannels, the peak-to-valley roughness Rz. (Data not shown; see FIG. 5 of priority application 61/020,789.) Four independent OP images were obtained from the bottom surfaces of four different microchannels in the Cu and Al coupons. Values of Rz obtained from the four OP images were averaged. The average Rz values measured for the bottom surfaces of the microchannels were 11.8 μm for Cu, and 8.2 μm for Al. Due to difficulties of optical access, values of Rz for the microchannel sidewalls were not obtained. From qualitative SEM observations, it is surmised that surface roughness of the microchannel sidewalls was somewhat smaller, about 5 μm.

As expected from the replication process, surface roughness on the microchannel bottoms mimicked the roughness of the top surfaces of the insert microprotrusions. The surface roughness on the mold insert is believed to result from preferential etching during the ECP step of insert fabrication. The observed Rz values, about 10 μm, were larger than what is typically obtained from mechanical micromilling of metals, and greatly exceeded what is typically obtained from electrodeposited metallic structures formed by LiGA processing.

Eutectic Bonding of Metal-Based Microchannel Structures Using Thin Film Intermediate Layers Another aspect of this invention pertains to joining two or more metallic structural components, one or both of which may contain microchannel features, using one or more thin film intermediate layers. The problem solved was to create uniform, mechanically strong bonds across numerous mating surfaces, of microscale dimensions, of possibly dissimilar metals, without requiring flux.

A preferred, novel technique employs flux-less, eutectic bonding. The metal components to be bonded were first subjected to plasma etching in vacuum, followed by deposition of an Al—Ge eutectic nanocomposite thin film. The plasma etch removed surface metals oxide, removing any need for flux. With small channel dimensions, the thickness of the eutectic nanocomposite intermediate layer should also be small to avoid microchannel blockage, typically ranging from below 1 micron to about 10 microns. The eutectic intermediate layer is used to ensure that the bonding interface will melt at a substantially lower temperature than the melting temperature of the metal components to be joined, thereby minimizing mechanical deformation at the temperature and pressure used for bonding. For example, we have successfully bonded Al-based microchannel structures in the temperature range 450° C. to 550° C., considerably below the 660° C. melting point of elemental aluminum.

Eutectic mixtures are generally not homogeneous, but are instead typified by a collection of domains, each of which consists primarily of one of the eutectic's elemental components. The domain size effectively dictates a lower limit on the size of areas to be joined by eutectic bonding. Indeed, it is preferred that the eutectic domain size should be substantially smaller than the dimensions of the areas to be bonded. For example, with an Al—Ge eutectic nanocomposite thin film, typical domain sizes are on the order of 100-200 nm. These small domains not only ensure uniform, strong bonding across areas that can have relatively small dimensions, but also ensure that melting across the entire bonding interface occurs at or near the lowest possible temperature (i.e., at or near the eutectic point), reducing the potential for mechanical deformation of the microchannels or other structures during bonding. The eutectic thin film intermediate layers may be fabricated, for example, by vapor phase deposition methods, such as physical or chemical vapor deposition onto metallic HARMS, or by sandwiching free-standing thin films of metals or alloys between the metallic pieces to be bonded. The melting point of the eutectic or near-eutectic thin film should be substantially below the melting point of the components to be bonded, preferably at least about 50° C.-100° C. lower.

The nanodomain eutectic bonding technique is not limited to plate-to-plate bonding. It may be used for other metal-to-metal bonding, for example to elaborate a plain or molded metal surface by serial addition of semi-layers, rods, alignment pins, and the like.

Bonding of Al-Based Microchannel Structures with Al—Ge Nanocomposite Thin Film Intermediate Layers.

Example 4: Synthesis of Al—Ge Nanocomposite Thin Films, and Bonding of One-Layer Devices Al—Ge composite thin films were deposited with a radio frequency (rf) inductively coupled plasma (ICP)-assisted hybrid tool, which combined a 13.56 MHz ICP with direct current (dc) balanced magnetron sputtering. One Al (99.99%) cathode and one Ge (99.99%) cathode, each 75 mm in diameter, were placed facing each other and were sputtered in current-controlled mode. The distance between the Al and Ge cathodes was about 250 mm. Substrates for Al—Ge deposition included Si wafers with diameter 50 mm, polished Al coupons (Al 1100, 99%+) with diameter 35 mm, and replicated Al HARMS (Al 1100, 99%+). The substrates were ultrasonically cleaned in acetone and methanol before being mounted on a rotatable holder between the two targets. The ultimate base pressure of the deposition system was less than $1.0 \times 10^{-8}$ Torr. Typical background pressures prior to deposition runs were about $1 \times 10^{-7}$ Torr.

The entire deposition sequence was carried out in an Ar (99.999%) atmosphere, with a total pressure of about 1.3 mTorr. The deposition sequence comprised a substrate surface etch, followed by codeposition of Al and Ge. Substrate etching occurred in a pure Ar ICP with a total input rf power of 1000 W, a substrate bias of −200 V, and an etch duration of 3 min. Sputtering of Al and Ge cathodes commenced immediately after substrate surface etch.

One series of Al—Ge composite films was deposited on Si(100) substrates. For this series of specimens, a fixed Al cathode current of 0.5 A was used, and the Ge cathode current was varied from 0.1 A to 0.5 A to alter the Ge composition within the film. The deposition duration was fixed at 30 min for this series of specimens. Additional depositions on flat Al coupons and replicated Al HARMS were carried out with a fixed Al cathode current of 1.0 A and a fixed Ge cathode current of 0.45 A for 60 min. The substrate bias was fixed at −100 V for all depositions. Substrates were rotated continuously in the center of the deposition zone at about 12 rpm during both etching and deposition. No intentional substrate heating or cooling was applied during the deposition process.

Bonding experiments were carried out using a MTS858 single-axis testing system interfaced to a custom-built high-vacuum chamber. A turbomolecular pump system produced an ultimate molding chamber base pressure of about $2 \times 10^{-9}$ Torr. Typical background pressures during bonding experiments were about $1 \times 10^{-6}$ Torr. Two heating stations were installed in the vacuum chamber. The lower heating station was mechanically attached to the bottom of the vacuum chamber. The upper heating station was connected to the linear actuator through a bellow-sealed motion feedthrough. The two heating stations were separately heated by resistive heating cartridges, and the temperatures were measured by two separate K-type thermocouples. Careful machining of the heating stations ensured that the surfaces of the two heating stations were parallel to each other and perpendicular to the actuator axis. The linear actuator could be programmed to move either according to prescribed load forces in a force-controlled mode, or according to prescribed actuator displacements in a displacement-controlled mode. The total axial force was measured by a 25 kN load cell, and the total axial displacement of the actuator was measured by a linear variable displacement transducer. Flat Al coupons and Al HARMS with Al—Ge composite films deposited on the bonding surfaces were placed face-to-face on the lower heating station. The chamber was evacuated, and both heating stations were heated to about 400° C. The upper heating station was then contacted with the Al assembly to be bonded, and an increasing compression force was applied to the assembly at a constant loading rate of 100 N/min. A constant force was held for 12 min after the compression force reached the desired level. The temperatures of both heating stations were increased during the compression force increase, so that the specimen temperature reached about 500° C. during the constant force hold. After the constant force hold, the linear actuator was withdrawn from the Al assembly and the system was allowed to cool down.

Examples 5 and 6: Characterization of Al—Ge Nanocomposite Thin Films and Bonding of Two-Layer Devices A similar bonding process was used to assemble an Al-based, two-layer, microchannel device. Al—Ge composite thin films, with an approximate thickness of ~2 µm, were deposited on both sides of a polished Al foil and the feature surfaces of two replicated Al HARMS. After Al—Ge film deposition, the two Al HARMS were placed face to face on the bottom heating station, with the Al foil inserted in the middle. Both heating stations were heated to slightly above 500° C., and the upper heating station was then placed in contact with the assembly. An increasing compression force was applied to the assembly at a constant loading of 300 N/min. A constant force was held for 10 min after the compression force reached ~1000 N, corresponding to an applied pressure of ~1.5 MPa. After the constant force hold, the linear actuator was withdrawn from the Al assembly and the system was cooled down.

A JEOL2010 transmission electron microscope (TEM) was used to characterize the micro- and nano-scale structure of the Al—Ge composite films. Cross-sectional TEM specimens of Al—Ge films deposited on Si(100) substrates were prepared with standard face-to-face gluing, mechanical thinning, dimple grinding, and ion milling using 4 kV Ar$^+$ ions at a 4° take-off angle on a Gatan Precision system. Compositional analysis of Al—Ge composite thin films was performed by energy dispersive X-ray spectroscopy (EDS). EDS measurements were made using a EDAX system equipped with an ultra-thin window detector, attached to a Hitachi S3600N scanning electron microscope (SEM). EDS spectra were collected at an electron beam energy of 15 keV and a detector take-off angle of 36°. SEM examinations of bonded Al assemblies were made on a Hitachi S3600N SEM.

Figure 5:
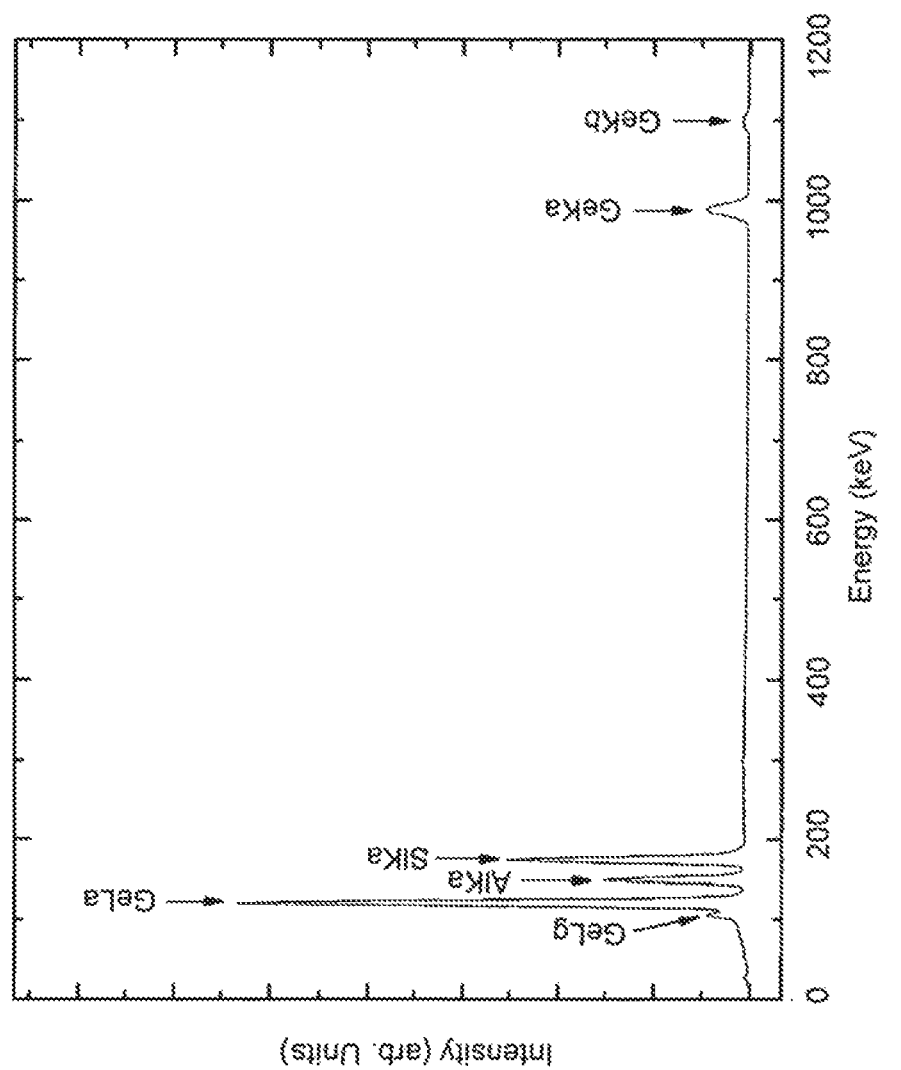
FIG. 5 depicts an EDS spectrum of an Al—Ge film that was deposited with an Al cathode current of 0.5 A and a Ge cathode current of 0.4 A.
Figure 6:
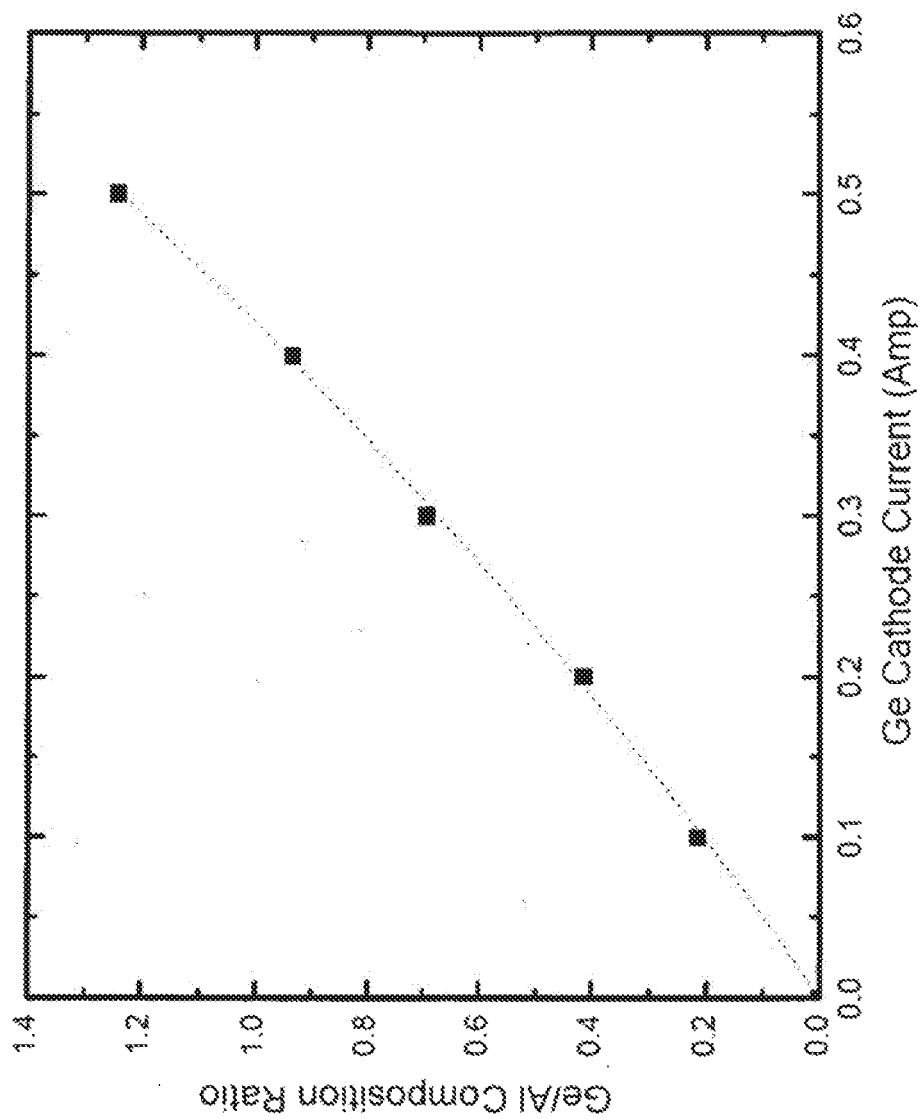
FIG. 6 depicts the Ge to Al composition ratios for a series of Al—Ge films that were deposited at a fixed Al cathode current of 0.5 A, as a function of the Ge cathode current. The dashed line is an interpolation between the measured points.

For eutectic bonding with an Al—Ge interlayer, the composition of Al—Ge films was measured and correlated to the deposition conditions. In addition, the micro- and nano-scale structure of the Al—Ge films was characterized. FIG. 5 depicts an EDS spectrum collected from one Al—Ge film, deposited at Al and Ge cathode currents of 0.5 A and 0.4 A, respectively. Similar EDS spectra were collected from Al—Ge films deposited at different Al and Ge cathode currents, at the same spectrometer settings, the same magnification, and from an identical area about 10 µm×10 µm. The manufacturer-supplied EDS data analysis software, EDAX Genesis (version 3.6), was used for automatic background fitting and removal. A standardless quantification routine employing ZAF corrections was included as a part of the data analysis software, and was used to obtain atomic percentages from raw EDS spectra. Spectra collected from Al—Ge films contained signals from Al and Ge within the film, as well as signal from the Si substrate. No oxygen signal was seen above the noise level. Because there was a strong signal from the Si substrate, only the ratio of Ge at. % composition to Al at. % composition was considered. FIG. 6 depicts the Ge to Al composition ratio for a series of Al—Ge films as a function of Ge cathode current, deposited at a fixed Al cathode current of 0.5 A. The thickness of this series of Al—Ge films, as measured by cross-sectional SEM, was about 360 nm. The deposition rate for this series of Al—Ge films was thus about 12 nm/min. As expected, the Ge composition increased with increasing Ge cathode current. The Ge to Al composition ratio for the film deposited at an Al cathode current of 0.5 A and a Ge cathode current of 0.2 A was close to the eutectic $Al_{70}Ge_{30}$ composition.

Cross-sectional TEM bright-field (BF) micrographs were taken of a film deposited at an Al cathode current of 0.5 A and a Ge cathode current of 0.3 A. The nanoscale structure of the Al—Ge films could be seen, from regions close to the Si(100) substrate to regions close to the top surface of the film. (Data not shown; see FIG. 8 of priority application 61/020,789.) High-resolution imaging showed that the region immediately adjacent to the Si(100) substrate, with dark contrast, was crystalline Ge, while regions with light contrast above the Ge layer were crystalline Al. These imaging results were also confirmed with a series of EDS spectra collected from the different regions. The bright-field micrographs provided strong evidence of phase separation within the co-deposited Al—Ge film. In companion dark-field (DF) micrographs, the Ge regions exhibited light contrast while the Al regions showed dark contrast. The dark-field micrographs again showed that a crystalline Ge layer formed next to the Si(100) substrate. (Data not shown; see FIG. 9 of priority application 61/020,789.) Immediately above the Ge layer, lateral separation occurred between the crystalline Ge and crystalline Al grains, roughly in a plane parallel to the substrate surface. As the Al—Ge film deposition continued, some Al grains began to spread laterally and cover the Ge region underneath, showing evidence of transverse separation between crystalline Ge and crystalline Al grains in the direction perpendicular to the substrate surface. Thus we saw evidence of both lateral and transverse separations between Ge and Al within the co-deposited Al—Ge film. A high-resolution micrograph of a co-deposited Al—Ge film with a composition close to eutectic clearly showed phase-separated Al-rich and Ge domains, typically several tens of nm in size (data not shown).

Without wishing to be bound by this hypothesis, it is believed that nanoscale separation between the crystalline Ge and crystalline Al domains within codeposited Al—Ge films resulted from competition between the thermodynamic driving force for Al—Ge phase separation and the growth kinetics dictated by the film deposition rate. For the purpose of using Al—Ge films for intermediate layer bonding, the Al and Ge domains in such codeposited films are on the order of 100 nm or smaller. This intimate mixing promotes eutectic melting of the entire Al—Ge film once the eutectic point $T_E$ is reached, and is beneficial for bonding of mating surfaces with microscale dimensions. Codeposition of Al—Ge films is a preferred route for making nanoscale phase-separated Al—Ge eutectic mixtures since it can produce an intimate mixture of Al and Ge domains with controlled phase separation. The film composition may be controlled by adjusting the individual Al and Ge sputter erosion rates.

Figure 7:
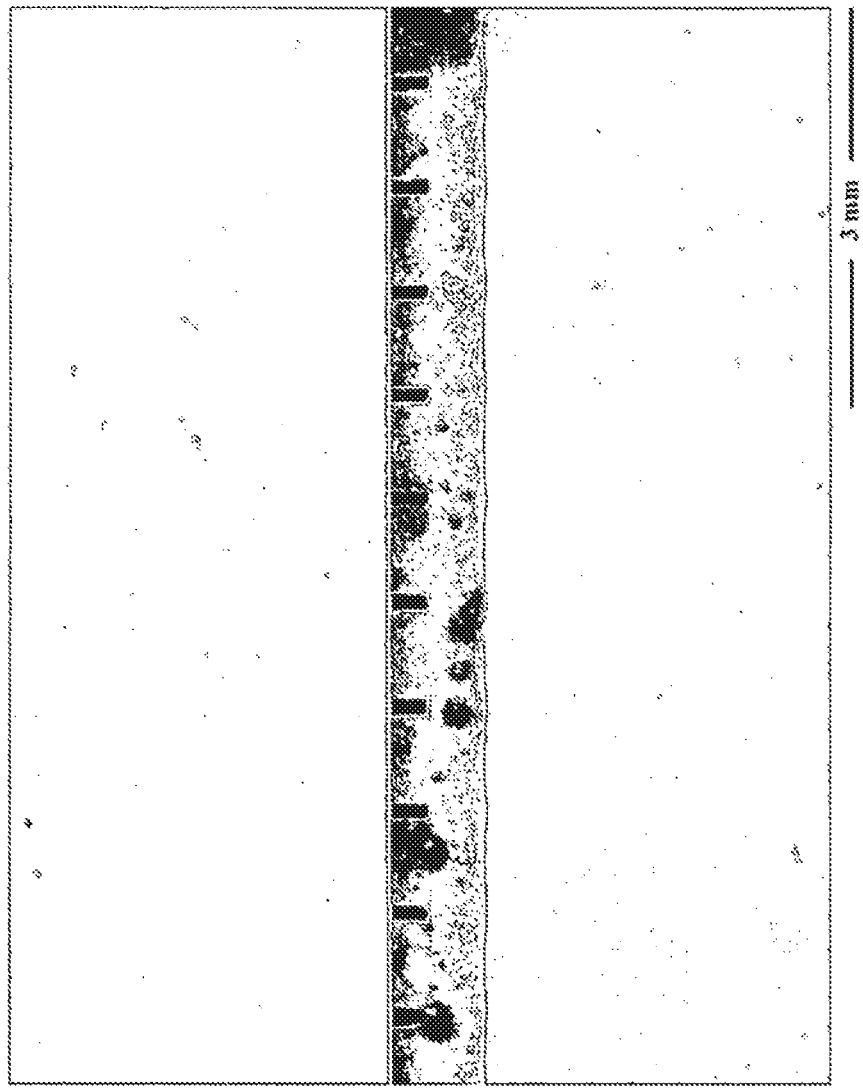
FIG. 7 depicts a cross-sectional view of an embodiment of a typical, one-layer, Al-based microchannel structure bonded with Al—Ge nanocomposite thin film intermediate layers.

In one embodiment, nanocomposite Al—Ge intermediate layers were codeposited onto a replicated Al HARMS with a parallel array of straight microchannels, and one flat Al coupon. To test the feasibility of simultaneously bonding features of different sizes, the microchannel width was varied between 120 µm and 180 µm. The Al—Ge intermediate layer was deposited at a fixed Al cathode current of 1.0 A and a fixed Ge cathode current of 0.45 A, making the film's composition close to eutectic. After the Al—Ge intermediate layers had been deposited, the replicated Al HARMS and the flat Al coupon were bonded at a final holding temperature of 510° C. The applied pressure during the final hold stage of bonding was about 1.5 MPa. FIG. 7 depicts a cross-sectional view of a typical, one-layer, Al-based microchannel structure following such bonding. The replicated Al microchannel structure and the flat Al coupon were bonded tightly together, with no evident gaps.

Figure 8:
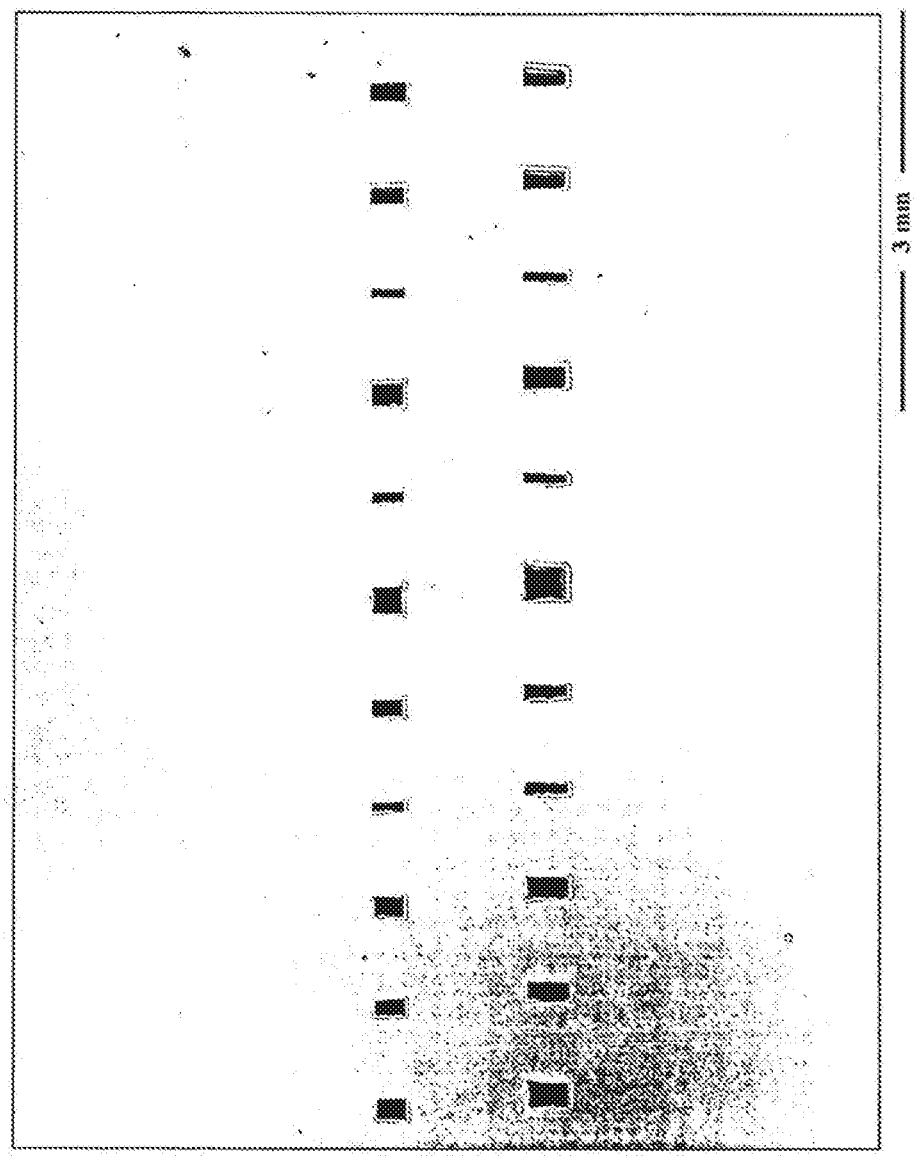
FIG. 8 depicts a cross-sectional view of an embodiment of a two-layer, Al-based, microchannel device bonded with Al—Ge nanocomposite thin film intermediate layers.
Figure 9:
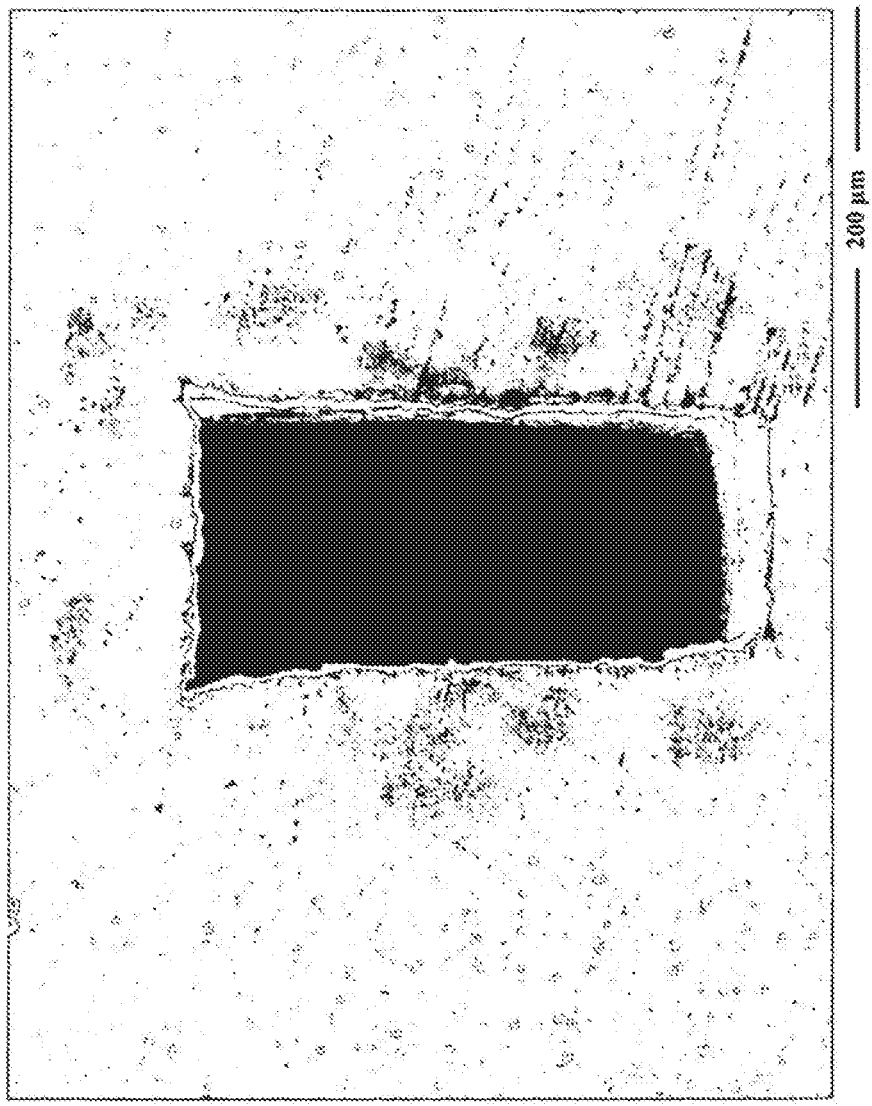
FIG. 9 depicts a high magnification view of a typical bonded Al microchannel from the device depicted in FIG. 8.

In another embodiment, two Al HARMS pieces were used to assemble a two-layer structure with closed microchannels. In each Al piece, a set of parallel rectangular microchannels, ~1 cm long and ~330 µm deep, was replicated in the Al bulk from surface-engineered Inconel X750 inserts by compression molding. Two plena were machined into the Al bulk and connected to the two ends of the microchannel array. To test the feasibility of simultaneously bonding microfeatures of different sizes, the widths of microchannels were varied from less than 80 µm to more than 250 µm. A polished Al foil, with an Al—Ge film deposited on both sides, was inserted between the two Al HARMS pieces, and the bonding process as described above was used to produce a three-piece Al assembly, containing two layers of parallel microchannels. Holes were drilled through the entire bonded specimen at the plenum regions on each side of the microchannels. Threaded holes were tapped into the Al bulk for external fluid connections. FIG. 8 depicts a cross-sectional view of a portion of the assembled two-layer microchannel structure, obtained by mechanical cutting. The structure contained two layers, with 20 microchannels in each layer. FIG. 9 depicts a close-up view of a typical bonded microchannel. The bonding interface is not even discernable in this high-magnification view, indicating the quality of bonding achieved.

Water was fed into one plenum, and it then flowed freely out of the cut cross-section as individual jets. (Not shown; see FIG. 13 of priority application 61/020,789.)

The replicated Cu and Al microchannel arrays each contained 19 rectangular microchannels. Our observations showed exit water jets from all 19 microchannels in the assembled Cu MHE, while exit water jets were observed from only 18 microchannels in the assembled prototype Al MHE. It appeared that one microchannel in the assembled Al MHE had been blocked during the bonding process; the reason for the blockage is not understood. Our measurements indicated that the average width of microchannels in the Cu prototype device exhibited little change from that on the as-replicated Cu coupon, while the average microchannel width of the Al device had decreased somewhat from that on the as-replicated Al coupon. Considering that Al bonding occurred at about 83% of the Al melting temperature, we speculate that the observed narrowing of the microchannels may have resulted from plastic deformation during the bonding process.

Examples 7 and 8: Bonding of Cu-Based Microchannel Structures with Al—Ge Nanocomposite Thin Film Intermediate Layers and Free-Standing Al Thin Films To prepare prototype embodiments of one-layer, enclosed, Cu-based microchannel structures, Cu coupons containing replicated microchannels were bonded onto a flat Cu plate. The thickness of both the flat plate and the Cu coupons was 6.4 mm. The bonding surfaces of the coupons and flat plates were mechanically polished with SiC abrasive papers, and finished with a 1 µm diamond particle suspension. Al—Ge composite thin film intermediate layers were deposited onto the polished surfaces by sputter co-deposition in a pure Ar (99.999%) atmosphere, at a pressure of ~1.3 mTorr. Two separate sputter targets were used, one for pure Al (99.99%) and the other for pure Ge (99.99%). The polished Cu coupons and plates were ultrasonically cleaned in acetone and methanol before being mounted on a rotatable holder in the middle of the deposition zone. The deposition sequence comprised a radio frequency (rf) inductively coupled plasma (ICP) substrate surface etch, followed by Al and Ge co-deposition. Substrate etching occurred in a pure Ar ICP with a total rf input power of 1000 W, a substrate bias of −100 V, and an etch duration of 20 min. Sputtering of Al and Ge targets commenced immediately after the substrate surface etch. Substrates were rotated continuously at ~12 rpm during both etching and deposition. All Al—Ge depositions were carried out using fixed target currents: 1.0 A for Al, and 0.45 A for Ge. The substrate bias during deposition was held at −50 V. These deposition parameters resulted in a composition ratio close to the $Al_{70}Ge_{30}$ eutectic. The deposition duration was 60 min, producing an Al—Ge film thickness of ~2 µm.

Figure 10:
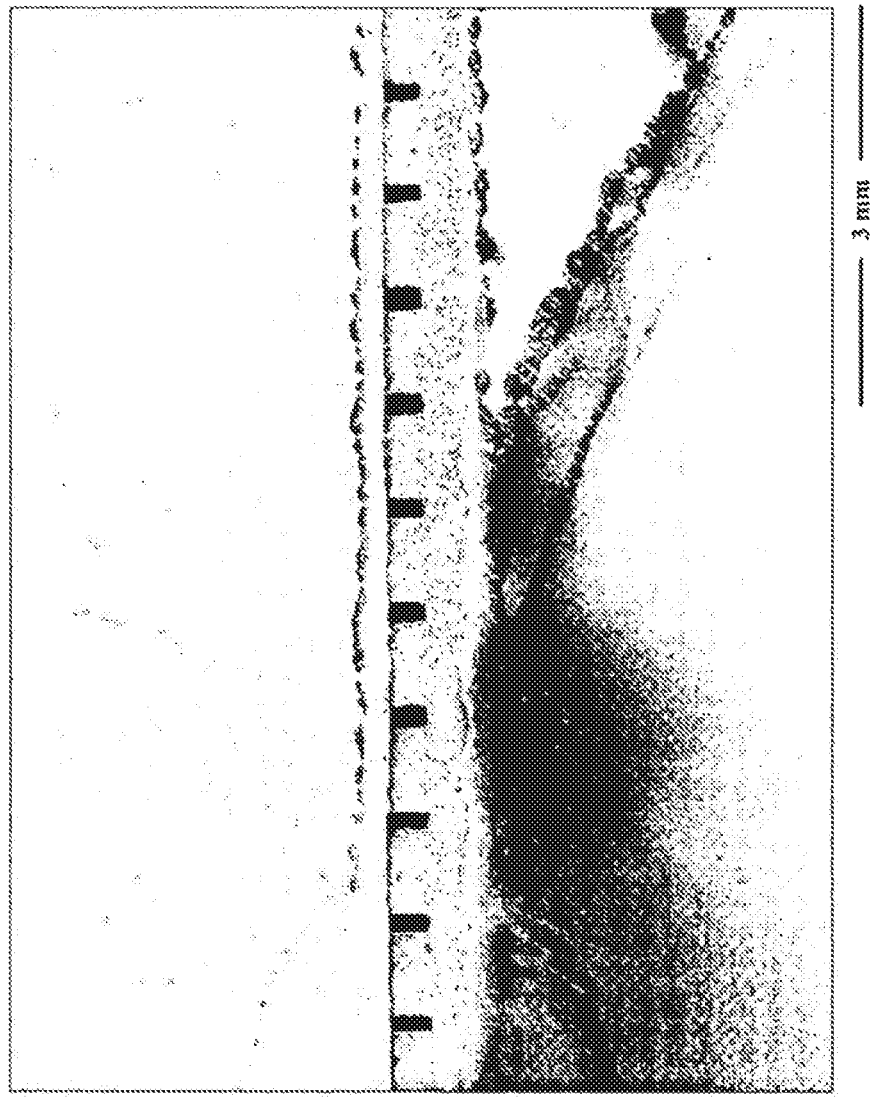
FIG. 10 depicts a cross-sectional view of a portion of a Cu-based microchannel structure bonded with Al—Ge nanocomposite thin film intermediate layers.

Bonding experiments were carried out using the MTS858 single-axis testing system interfaced to a high-vacuum chamber containing two heating stations. Cu coupons containing microscale features and flat Cu plates, with Al—Ge composite films deposited on the bonding surfaces, were placed face-to-face on the lower heating station. The chamber was evacuated, and both heating stations were heated. Bonding of the Cu coupon and plate occurred at a temperature about 540° C. with an applied pressure about 3 MPa. FIG. 10 depicts a cross-sectional view of a portion of a prototype Cu microchannel structure bonded with Al—Ge nanocomposite thin film intermediate layers.

Figure 11:
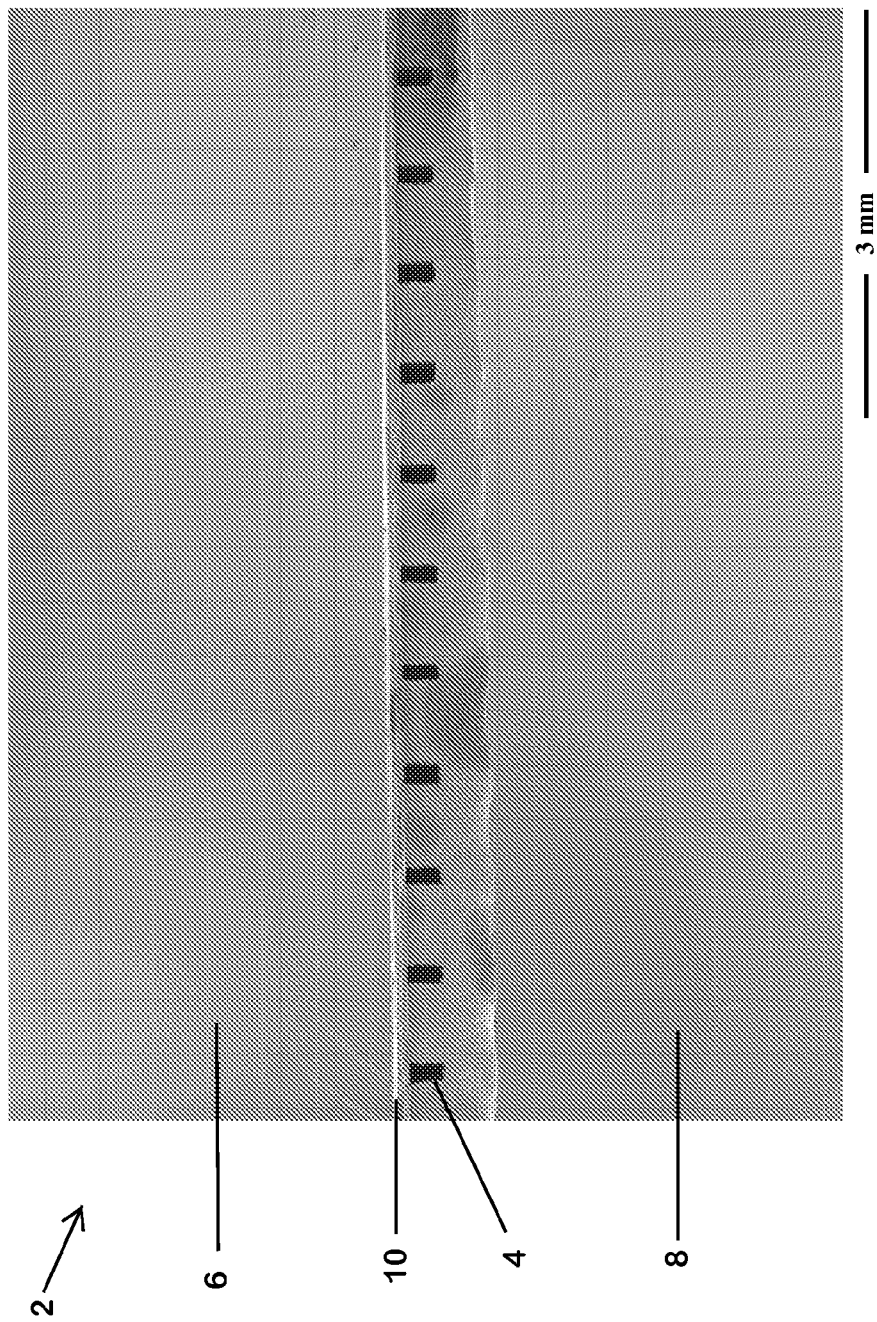
FIG. 11 depicts a cross-sectional view of a portion of a Cu-based microchannel structure bonded with a 10 µm free-standing Al thin film intermediate layer.

In an alternative embodiment, Cu microchannel structures were bonded with a single free-standing Al thin film as the intermediate layer. To form Cu-based, single-layer, microchannel structures, one Cu coupon containing a parallel array of replicated microchannels and one blank Cu coupon were placed face to face on the bottom heating station, with a 10 µm thick Al free-standing thin film inserted in the middle. Surfaces of Cu coupons were polished with 1200-grit silicon carbide papers prior to bonding. The entire assembly was placed on top of the bottom heating station. After evacuation, both heating stations were heated above 500° C., and the upper heating station was then put into contact with the assembly. An increasing compression force was applied to the assembly at a constant loading rate of 300 N/min. The force was held constant for 15 min after the compression force had reached the desired level of ~3000 N, corresponding to an average applied pressure of about 3 MPa. The final bonding temperature for the coupon/block/coupon assemblies was held at about 580° C. After the constant force hold, the linear actuator was withdrawn from the assembly and the system was cooled down. FIG. 11 depicts a cross-sectional view of a portion of one Cu microchannel structure bonded with one free-standing Al thin film intermediate layer. FIG. 11 depicts a cross-sectional micrograph of a microchannel heat exchanger 2 containing microchannels 4, and comprising a first homogeneous metal piece 6, a second homogeneous metal piece 8, and eutectic layer 10. Comparing FIGS. 10 and 11 shows that both bonding approaches produced clean, enclosed microchannel structures without blockages.

Examples 9 and 10: Evaluation of the Strength of Bonded Al—Al and Cu—Cu Interfaces Tensile testing specimens were prepared to evaluate the strength of Al—Al interfaces bonded with Al—Ge eutectic nanocomposite thin film intermediate layers. Al—Ge composite films were deposited onto the bonding surfaces of two cuboid Al coupons, ~22 mm×~22 mm in area. The two Al coupons were placed face-to-face on the bottom heating station, forming an assembly ~36 mm long in the direction perpendicular to the bonding interface. A small hole was drilled at the corner of the bottom Al coupon close to the bonding interface. A K-type thermocouple was inserted into the hole to measure the temperature of the interface during bonding. After the chamber was evacuated, both heating stations were heated to temperatures about 10 degrees higher than the target bonding temperatures, which were 450, 500, and 550° C. for different tests. During the heating process, the top heating station was held close to the top surface of the Al coupon assembly but was not in contact with it. The temperature of the bonding interface during this initial heating process, as measured by the K-type thermocouple, was always less than 390° C., below the Al—Ge eutectic temperature of 424° C. Once the bottom and top heating stations had reached steady state temperatures, the upper heating station was put into contact with the Al coupon assembly using the linear actuator. A linearly increasing compression force was applied to the Al coupon assembly such that loading force levels of 250, 500, and 750 N were reached after a constant duration of 8 min. These loading forces corresponded to applied pressures of ~0.5, ~1.0, and ~1.5 MPa, respectively. A constant force was held for 10 min after the compression force reached the desired levels. During the compression force increase, the temperature of the bonding interface increased to close to the target temperature of 450, 500, or 550° C. Further temperature increases were registered on the K-type thermocouple during the constant force hold. For all bonding runs, the total temperature change measured by the K-type thermocouple during the 10 min constant force hold was less than 12° C. The nominal bonding temperature was taken to be the average value of the K-type thermocouple reading during the 10 min constant force hold. After this hold period, the heaters were turned off to cool the bonded specimen, with the same force still applied. After the temperature of the bonding interface had decreased below 400° C., the linear actuator was withdrawn from the Al assembly, and the system was cooled down to room temperature.

We prepared a series of two Al-coupon assemblies bonded at different temperatures, different applied pressures, and different thicknesses of Al—Ge intermediate layers. Using a Struers Accutom5 cutting machine, the four outermost sections along the axial direction, each ~3-4 mm thick, were removed from the bonded Al specimen. From the remaining specimen, which was ~14 mm×~14 mm×~36 mm, four tensile testing specimens were obtained with two perpendicular, bisecting cuts parallel to the axial direction, resulting in final tensile specimens ~7 mm×~7 mm×~36 mm. After cutting, the four surfaces of the tensile specimen parallel to the axial direction were mechanically polished with 600 grit silicon carbide papers. Tensile testing was conducted along the specimen's axial direction to evaluate the tensile strength of the bonding interface, using a MTS810 system with hydraulic grips. Surface morphologies of the fractured bonding surfaces were examined on a Hitachi S3600N scanning electron microscope (SEM), as well as with an X-ray dispersive spectroscopy (EDS) system (EDAX) equipped with an ultra-thin window detector.

Figure 12:
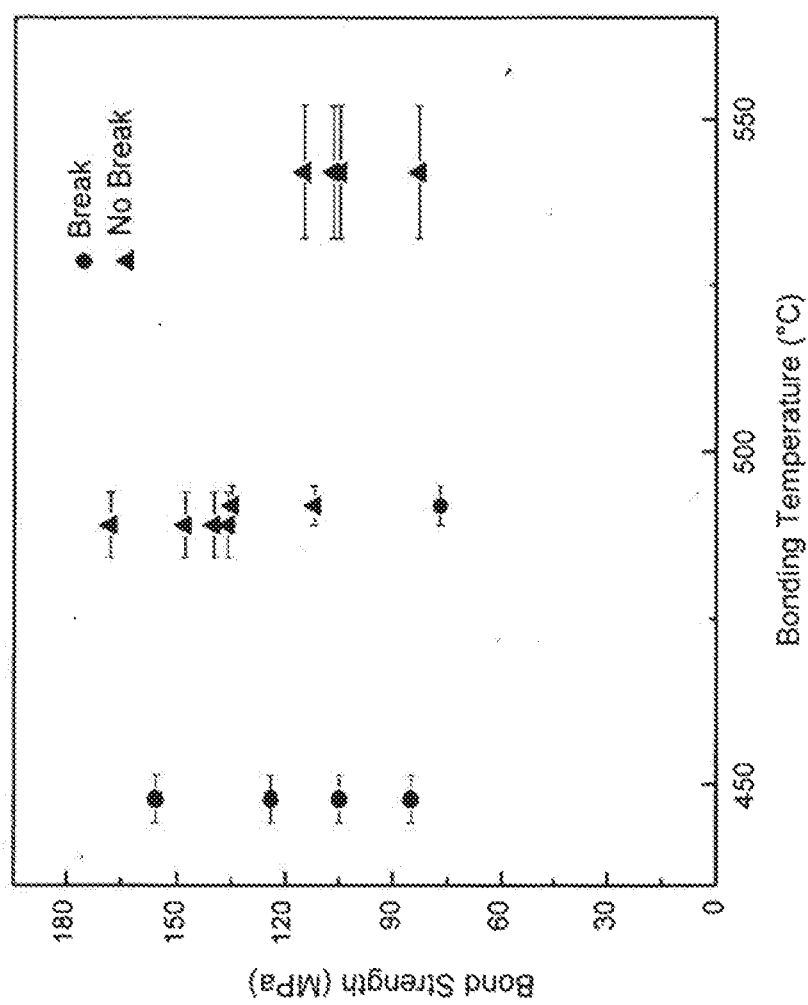
FIG. 12 depicts measured Al—Al interface bond strength as a function of bonding temperature.

FIG. 12 summarizes the results of our measurements of bond strength as a function of bonding temperature. For this series of measurements, all bonding runs were conducted at an applied pressure of ~1.5 MPa, with a ~2 μm Al—Ge intermediate layer deposited on each bonding surface (i.e., total thickness of both Al—Ge intermediate layers at the bonding interface was ~4 μm). Of 15 tensile tests total, the four performed on specimens corresponding to a bonding temperature of ~450° C. all resulted in clean breaks at the bonding interface (denoted "break" in the figure). Of the seven tests performed on specimens corresponding to a bonding temperature of ~500° C., only one resulted in breaking at the bonding interface. The other six tests resulted in deformations at the gripped sections without any break at the bonding interface (denoted "no break" in the figure). All four tests performed on specimens corresponding to a bonding temperature of ~550° C. resulted in deformations at the gripped sections only (denoted "no break"). It is evident from FIG. 12 that the measured values of bond strengths exhibited significant scatter. At a bonding temperature of ~450° C., measured bond strength varied from ~85 to ~156 MPa; and at a bonding temperature of ~500° C., measured bond strength varied from ~77 to greater than ~167 MPa.

Figure 13:
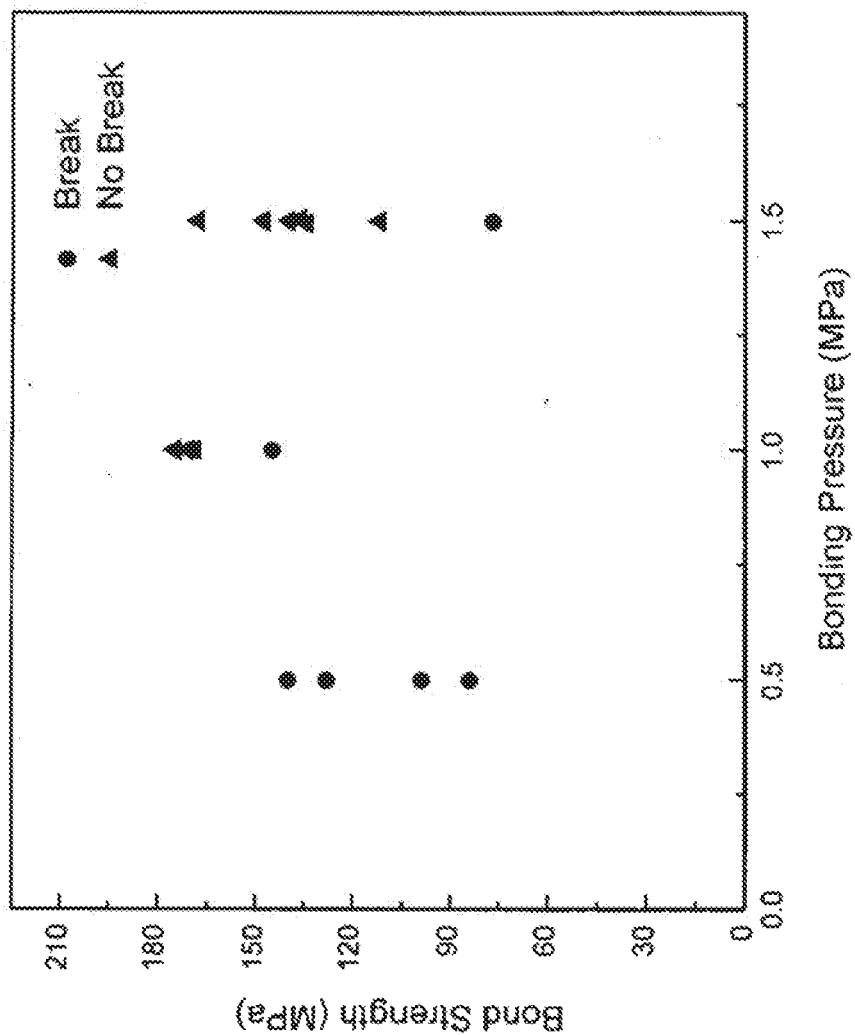
FIG. 13 depicts measured Al—Al interface bond strength as a function of applied pressure during bonding.

FIG. 13 summarizes results of bond strength measurements as a function of the pressure that was applied during bonding. For this series of measurements, all bonding runs were performed at a bonding temperature of ~500° C., with a ~2 μm Al—Ge intermediate layer deposited on each bonding surface (i.e., total thickness of both Al—Ge intermediate layers at the bonding interface was ~4 μm). At the lowest applied pressure of ~0.5 MPa, all four tensile tests resulted in clean breaks at the bonding interface, yielding measured values of bond strength from ~84 to ~140 MPa. Of 11 tensile tests performed on specimens bonded at applied pressures of ~1.0 or ~1.5 MPa, only two tests resulted in breaks at the bonding interface. The remaining specimens failed at the gripped sections during testing. Of these tests, the highest strength values obtained were higher than 175 and 167 MPa, at applied pressures of ~1.0 and ~1.5 MPa, respectively.

Figure 14:
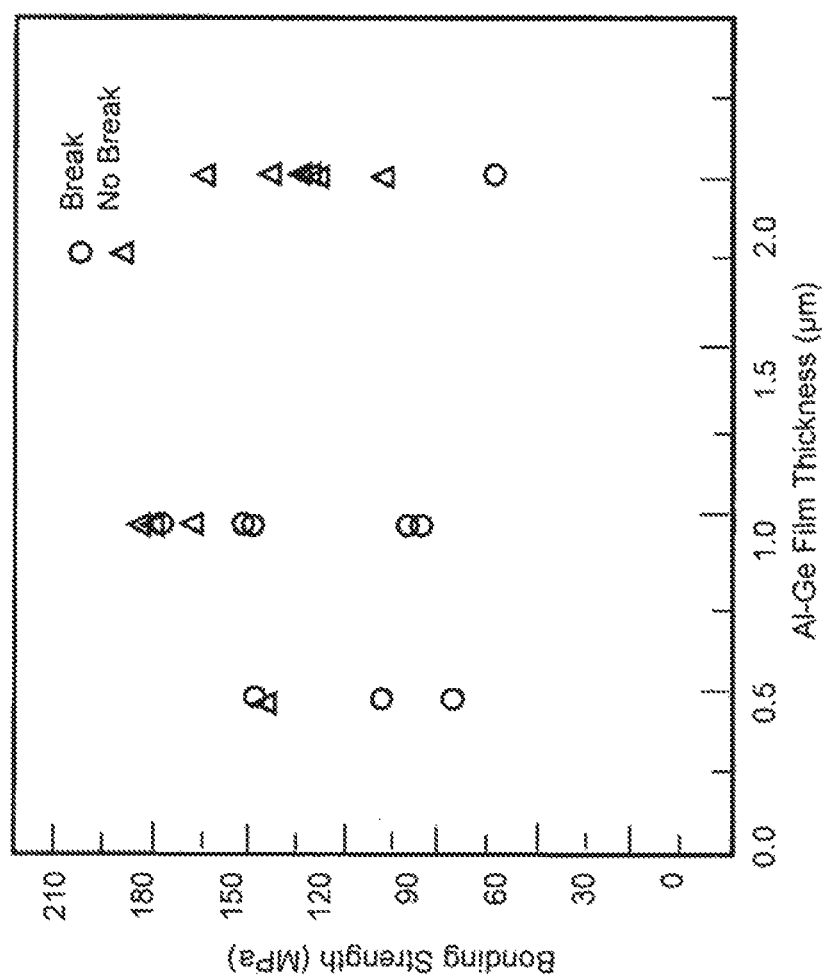
FIG. 14 depicts measured Al—Al interface bond strength as a function of the thickness of the nanocomposite Al—Ge thin film intermediate layer deposited on bonding surfaces.

FIG. 14 summarizes results of bond strength measurements as a function of the thickness of the Al—Ge intermediate layer. For this series of measurements, all bonding runs were performed at a bonding temperature of ~500° C. and an applied pressure of ~1.5 MPa. At the smallest Al—Ge film thickness of ~0.5 μm, measured bond strengths ranged from 89 to over 152 MPa. No gross differences were discerned in tests performed on specimens bonded at Al—Ge film thicknesses of ~1.0 or ~2.0 μm, with the highest measured bond strengths exceeding 167 MPa in both cases. The maximum observed strength was obtained at an Al—Ge film thickness of ~1.0 μm, exceeding ~188 MPa. At the three Al—Ge film thicknesses of ~0.5, ~1.0, and ~2.0 μm, a similar scatter in bond strengths was observed. The data shown in FIGS. 12-14 indicated that, notwithstanding the scatter in the measurements, interfacial strength values exceeded ~77 MPa, or ~770 atmospheres, under all bonding conditions tested.

The structures of the Al—Al interfaces within the bonded Al microchannel structures were examined by combining SEM with focused ion beam (FIB) images (data not shown). The imaged area, approximately 250 μm×190 μm, was close to one corner of a microchannel. Prior to SE image and EDS spectrum acquisition, the entire area was lightly etched with a $Ga^+$ ion beam. The secondary electron (SE) image showed a band with speckled contrast around the location of the original bonding surfaces, with a width of ~100 μm. The speckling apparently arose from Ge precipitates, as it was generally in the same locations corresponding to a Ge-L X-ray intensity image (data not shown). The Ge precipitates ranged in size from <1 to ~4 μm. A band of Ge precipitates also surrounded the sidewall of the Al microchannel, where the mating Al plate was not present. The Al—Ge thin film had been deposited onto the microchannel sidewall during sputter-codeposition, which likely accounts for the presence of Ge precipitates around the sidewall of the Al microchannel.

To confirm that the Ge precipitate band was not an artifact of the mechanical polishing process, a perpendicular cut, ~38 μm long and ~20 μm deep, was made with a focused $Ga^+$ ion beam into the cross section surface. This cut straddled the location of the original bonding surfaces. Ge precipitates, ranging from ~0.7 μm to ~4 μm, were seen dispersed within Al grains 10 μm and larger in an apparently random fashion (data not shown). The presence of Ge precipitates was also confirmed by corresponding Al—K and Ge-L X-ray intensity maps (data not shown). Other than the presence of the random Ge precipitates, no clear demarcation could be seen to indicate the location of the bonding surfaces of the two original Al pieces. Our observations indicated that the Ge precipitates were distributed in an approximately uniform manner across an extended interface region ~100 μm wide. SE images, and Al—K and Ge-L X-ray intensity maps also showed the presence of a band of Ge precipitates surrounding the location of the original bonding surfaces, with a width of ~100 μm.

Consistent observations were made in tensile fracture surfaces of bonded Al—Al specimens. For example, in an SE image of a tensile fracture surface of a specimen bonded at ~500° C., faceted regions with sizes ranging from <1 to ~4 μm were interdispersed with regions containing numerous micron and submicron sized dimples (data not shown). The chemical compositions of the faceted and dimpled regions were probed by EDS mapping. Faceted regions yielded low Al—K and high Ge-L counts, representing exposed Ge crystallites. Dimpled regions had low Ge-L counts, and represented the Al matrix. Our SEM fractography measurements confirmed Al—Ge phase separation within the bonding interface region. The presence of faceted Ge crystallites on the fracture surface suggested that separations occurred either at interfaces between Ge crystallites and the Al matrix, or across Ge crystallites in a brittle manner; while the observation of micro/nano scale dimples on the fracture surface suggested that separation of the Al regions involved ductile fracture.

Without wishing to be bound by this hypothesis, we believe that these observations support our proposed explanation for the high average tensile strength measured at the bonded Al—Al interface. The Al—Ge intermediate layer bonding process effectively joined the Al coupon with the flat Al plate across an extended interface region, with no demarcation at the location of the original bonding surfaces.

The average tensile bond strength was dominated by ductile fracture of the Al matrix within this extended interface region. The approximately uniform distribution of Ge precipitates, <4 μm in size, within this extended interface region ~100 μm wide meant that the region of Ge precipitates across the cross section was lower than would be the case where all Ge atoms concentrated within a narrow interface region. This dispersal of the Ge precipitates increased the fractional area of Al—Al bonds, and thus the average tensile strength.

Without wishing to be bound by this hypothesis, we believe that certain mechanisms likely predominated throughout the extended bonding interface region. During bonding, the two solid Al pieces were in contact with a layer of Al—Ge eutectic liquid, ~4 μm thick. Because bonding occurred at ~500° C., above $T_E$=424° C., there was likely some broadening of the liquid layer by dissolution of solid Al into the Al—Ge eutectic liquid. Simple calculations suggested that the composition shift likely broadened the Al—Ge liquid layer from ~4 to ~6 μm. Furthermore, the solidus reaction and Ge diffusion into the solid aluminum broadened the bonding interface region to ~50 μm. Additional cross-sectional metallographic observations around the bonding interface region showed Al grains spanning the entire bonding interface region, suggesting the possibility of epitaxial re-growth from un-melted Al grains.

Without wishing to be bound by this hypothesis, we believe that the nanoscale domain size of the Al-rich and Ge regions within the Al—Ge intermediate layer, together with eutectic melting, aids the broadening of the bonding interface region, and improves the bonding of microscale Al-based structures. Generally similar results are expected using other eutectic bonding intermediates.

Tensile testing specimens were prepared to evaluate the strength of Cu—Cu interfaces bonded with an Al thin film intermediate layer. Two rectangular Cu coupons (~25 mm×~16 mm×~16 mm), with surfaces mechanically polished to less than 1 μm roughness, were bonded with one Al thin film intermediate layer. The two Cu coupons were placed face to face on the bottom heating station with a thin Al film (Al 1100, 99%+) inserted in the middle, forming an assembly ~32 mm long in the axial direction, perpendicular to the bonding interface. A small hole was drilled at the corner of the bottom Cu coupon close to the bonding interface, into which a K-type thermocouple was inserted. After the chamber was evacuated, both heating stations were heated. The top heating station was close to the top surface of the Cu coupon assembly, but not in contact with it. After the bottom and top heating stations reached 500° C., the upper heating station was placed in contact with the Cu coupon assembly using the linear actuator. A linearly increasing compression force was applied to the Cu coupon assembly, so that loading force levels of 425, 850, and 1700 N were reached after a constant duration of 10 min. These compressive loading forces corresponded to average applied pressures of ~1, ~2, and ~4 MPa, respectively. A constant force hold was executed after the compression force reached the desired level. During the compression force increase, the temperatures of the bottom and top heaters were raised, leading to further temperature increase at the bonding interface. The interface temperature was recorded continuously during the constant force hold, 12 min after the interface temperature reached ~550° C., corresponding to the Al—Cu eutectic temperature of 548° C. During this 12 min hold, the interface temperature increased further and reached steady state. This steady state temperature, as measured by the K-type thermocouple, was taken as the nominal bonding temperature. After the 12 min hold, the heaters were turned off with the same force still applied. After the temperature of the bonding interface decreased to <450° C., the linear actuator was withdrawn from the top surface of the Cu assembly, and the system was cooled to room temperature.

A series of Cu two-coupon assemblies was bonded at different applied pressures and with different thicknesses of Al films. Using a Struers Accutom5 precision cutting machine, the four outermost sections along the axial direction, ~2-3 mm thick, were removed from the bonded Cu specimen. From the remaining specimen, ~20 mm×~12 mm×~32 mm, four tensile testing specimens were obtained by making two perpendicular bisecting cuts parallel to the axial direction, resulting in a final tensile specimens ~10 mm×~6 mm×~32 mm. After cutting, the four surfaces of the tensile specimen parallel to the axial direction were mechanically polished with 600-grit silicon carbide papers to remove irregularities. Tensile testing along the specimen axial direction was performed to evaluate the tensile strength of the bonding interface, using an MTS810 system with hydraulic grips. X-ray diffraction (XRD) patterns from fractured bonding surfaces were collected on a Rigaku MiniFlex X-ray diffractometer using Cu Kα radiation.

Tensile testing was performed on bonded Cu two-coupon assemblies. During tensile testing, the two ends of the specimen were gripped by the hydraulic grips. The gripped sections were ~10 mm long, leaving an un-gripped section ~12 mm long, with the bonding interface in the middle. As the specimen extension increased, the tensile stress increased to a maximum, followed by breaking at the bonding interface and a rapid drop in stress. The maximum tensile stress observed on the stress-extension curve is a measure of the tensile bond strength.

Figure 15:
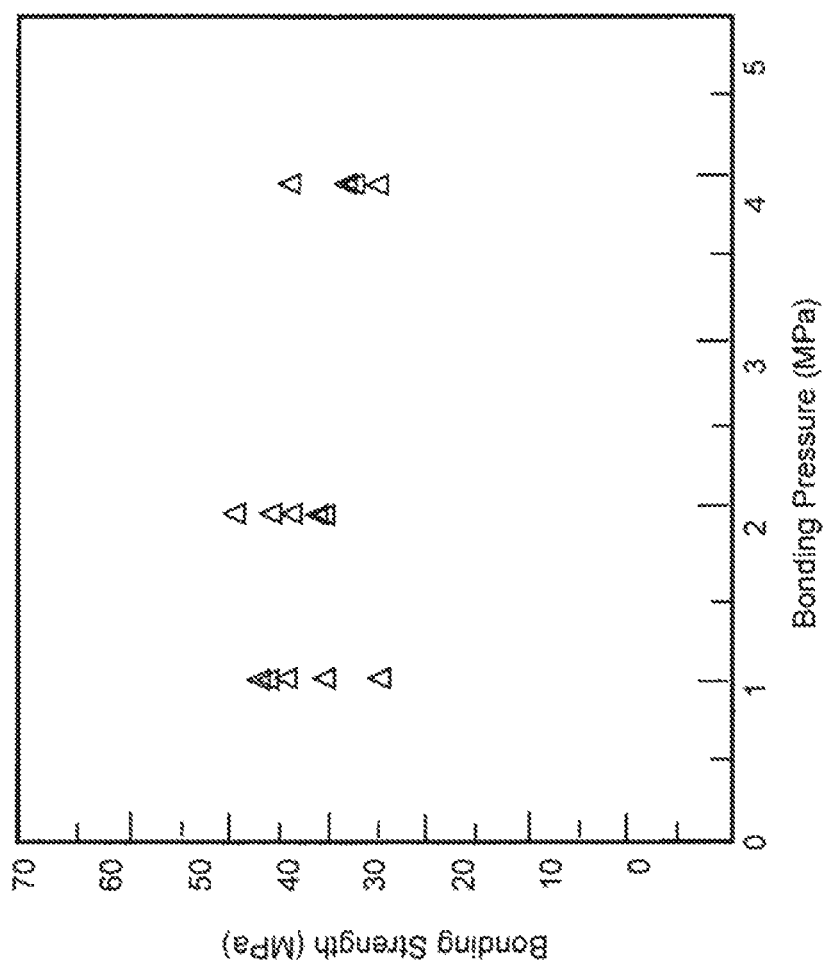
FIG. 15 depicts measured Cu—Cu interface tensile bond strength as a function of the average applied pressure.

FIG. 15 depicts measured bond strength as a function of the applied bonding pressure. For this series of measurements, all bonding runs were performed at ~580° C. with an Al film thickness of ~25 μm. In all cases, clean breaks occurred at the bonding interface. At the lowest pressure of ~1 MPa, measured bond strength ranged from 33 to 45 MPa. No significant difference was seen in tests performed on specimens bonded instead at pressures of ~2 or ~4 MPa. The maximum strength measured was ~48 MPa.

Figure 16:
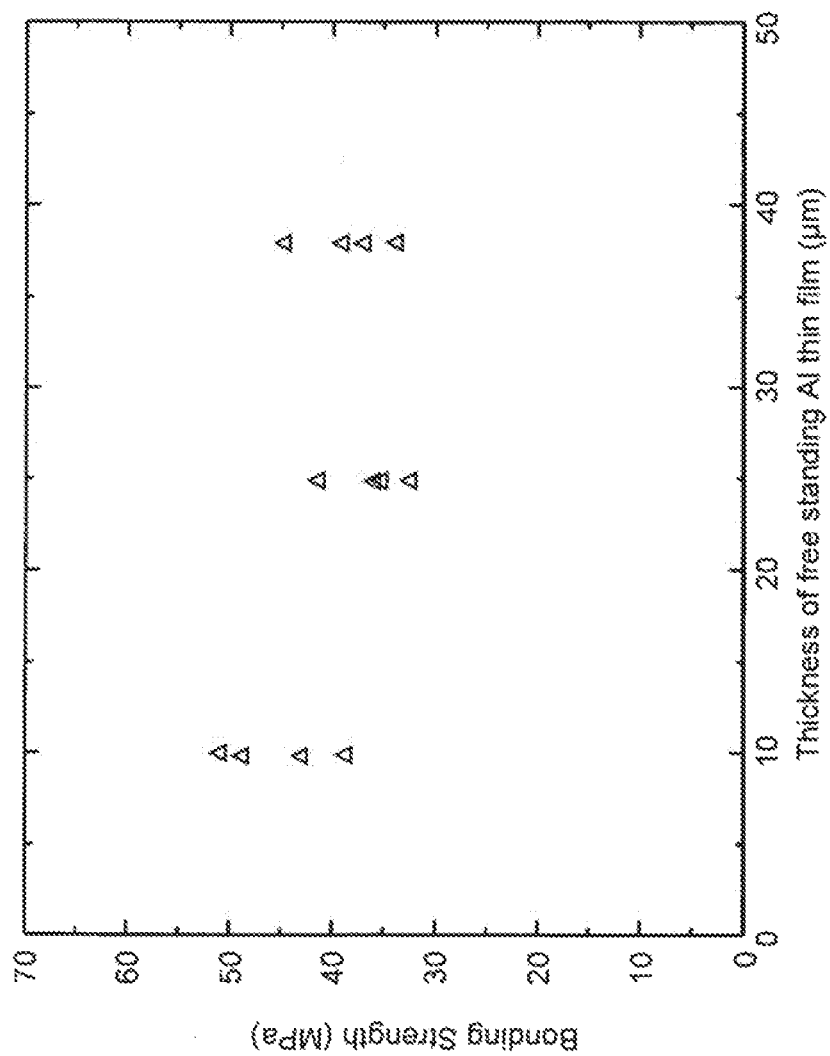
FIG. 16 depicts measured Cu—Cu interface tensile bond strength as a function of the thickness of the free-standing Al thin film intermediate layer.

FIG. 16 depicts measured bond strength as a function of the thickness of the Al film at the bonding interface. For this series of measurements, all bonding runs were performed at ~580° C. at an applied pressure of ~4 MPa. At the lowest Al film thickness of ~10 μm, measured bond strength ranged from 39 to 52 MPa. No gross differences were evident in tests performed on specimens bonded with Al films with thickness of ~25 or ~38 μm. Measured bond strength values ranged from 33 to 46 MPa. Data shown in FIGS. 15 and 16 indicated little variation in bond quality within the range of applied pressure and Al film thickness tested.

Figure 17:
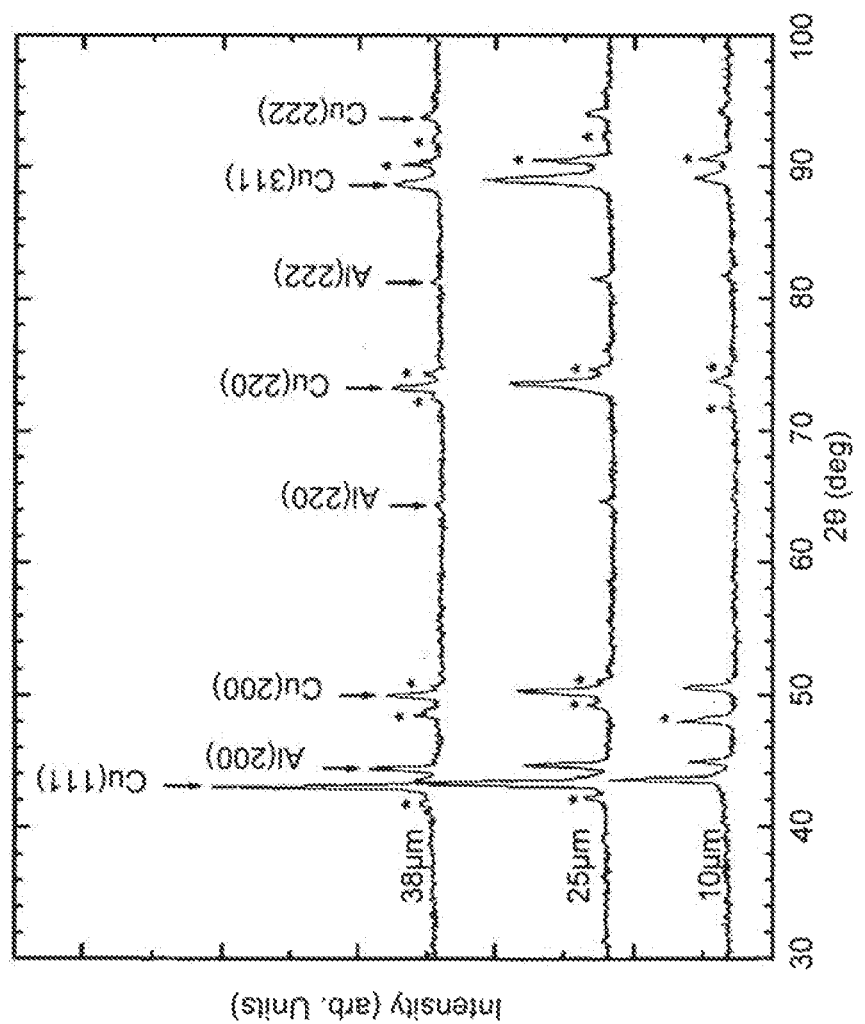
FIG. 17 depicts three X-ray diffraction patterns obtained from three fractured Cu interfaces that had been bonded with free-standing Al thin film intermediate layers, 10, 25, and 38 µm thick.

FIG. 17 depicts three XRD patterns obtained from fracture surfaces bonded at Al film thicknesses of 10, 25, and 38 μm, respectively. Major diffraction peaks within all three patterns can be assigned to either an fcc Cu phase, or to a fcc Al phase, indicating the presence of these phases in the interface region after bonding. The lattice parameters for the Cu phase were 3.663 Å, 3.658 Å, and 3.667 Å at Al foil thicknesses of 10, 25, and 38 μm, respectively. In comparison, the lattice parameter for the starting Cu coupon was measured at 3.618 Å. The corresponding lattice parameters for the Al phase were 4.102 Å, 4.103 Å, and 4.111 Å, respectively. In comparison, the lattice parameter for elemental Al is 4.05 Å. The respective lattice parameter increases over those of elemental Cu and Al suggest the possibility that there may have been some dissolution of Al into Cu and vice versa in the interface region. Besides those indexed to fcc Cu and fcc Al phases, other diffraction peaks were seen in all three XRD patterns, indicating the formation of additional Al—Cu compounds within the interface region during bonding. According to the standard Al—Cu phase diagram, a single eutectic should exist between the fcc Al phase and the $\theta$-$Al_2Cu$ phase. If bonding occurred solely via the eutectic mechanism, only the $\theta$-$Al_2Cu$ phase would be expected to be present in the interface region. Not all the additional diffraction peaks present within the three XRD patterns can be assigned to $\theta$-$Al_2Cu$, however, suggesting the presence of Al—Cu compounds other than $\theta$-$Al_2Cu$ in the interface region and suggesting that bonding may have occurred via a combination of both eutectic and diffusional mechanisms.

Assembly of Metal-Based Microchannel Devices

Another aspect of this invention pertains to the fluidic transitions from the microchannel arrays to larger scale plena. To create functional metal-based microchannel devices, for example for heat exchanger applications, it is desirable to have techniques to fabricate unobstructed fluidic transitions from microchannel arrays to larger scale plena. The larger scale plena are used to provide fluidic inlet and outlet connections to the "outside world."

Factors in designing microchannel-to-large-plenum transitions are ease of operation, and the parallel creation of many transitions at once. Serial subtractive fabrication techniques are not well-suited for this purpose. For example, micromilling would involve contact of a milling tool with formed microchannels, and could cause deformation at the microchannel-to-plenum transitions, leading to partial or complete blockage. This mechanical machining also demands small-scale tooling, perhaps on the order of 100 micron or even smaller. Furthermore, this kind of serial operation creates only one transition at a time, and is very time consuming for a large number of connections for microchannel arrays. It is therefore preferred that fabrication protocols should involve parallel forming or machining. Non-contact machining methods are also preferred.

Figure 18:
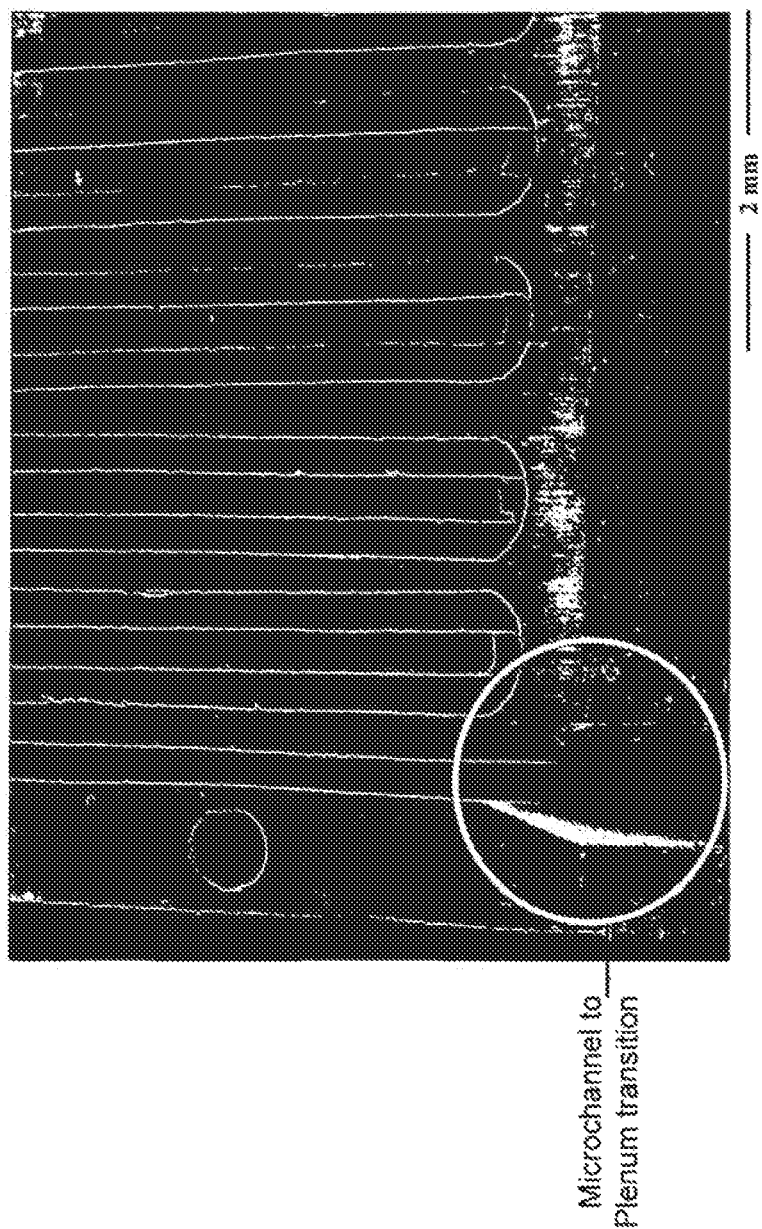
FIG. 18 depicts one embodiment showing a transition from a long meandering microchannel to a broadened outlet leading to a larger fluid plenum.

Example 11: Creating Microchannel-To-Large-Plenum Fluidic Transitions by Molding Replication FIG. 18 depicts an example of a mold insert design suitable for creating a microchannel-to-large-plenum fluidic transition by molding. In this embodiment, a long meandering microchannel terminates at a triangular opening, which can widen into a large scale plenum. The microchannel structure shown in FIG. 18 can be created by molding replication.

Figure 19:
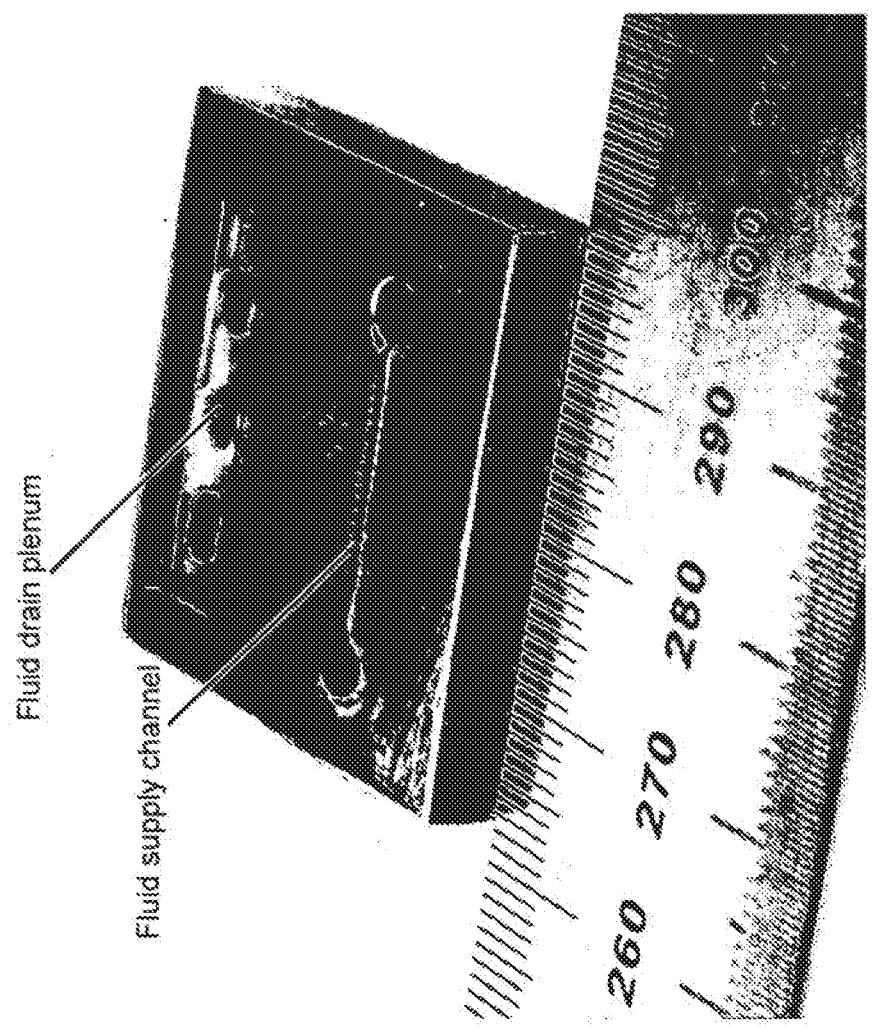
FIG. 19 depicts a molded Cu coupon containing an array of rectangular microchannels, a fluid supply channel, and a fluid drain plenum. Numbers shown on the ruler in the foreground are in mm.
Figure 20:
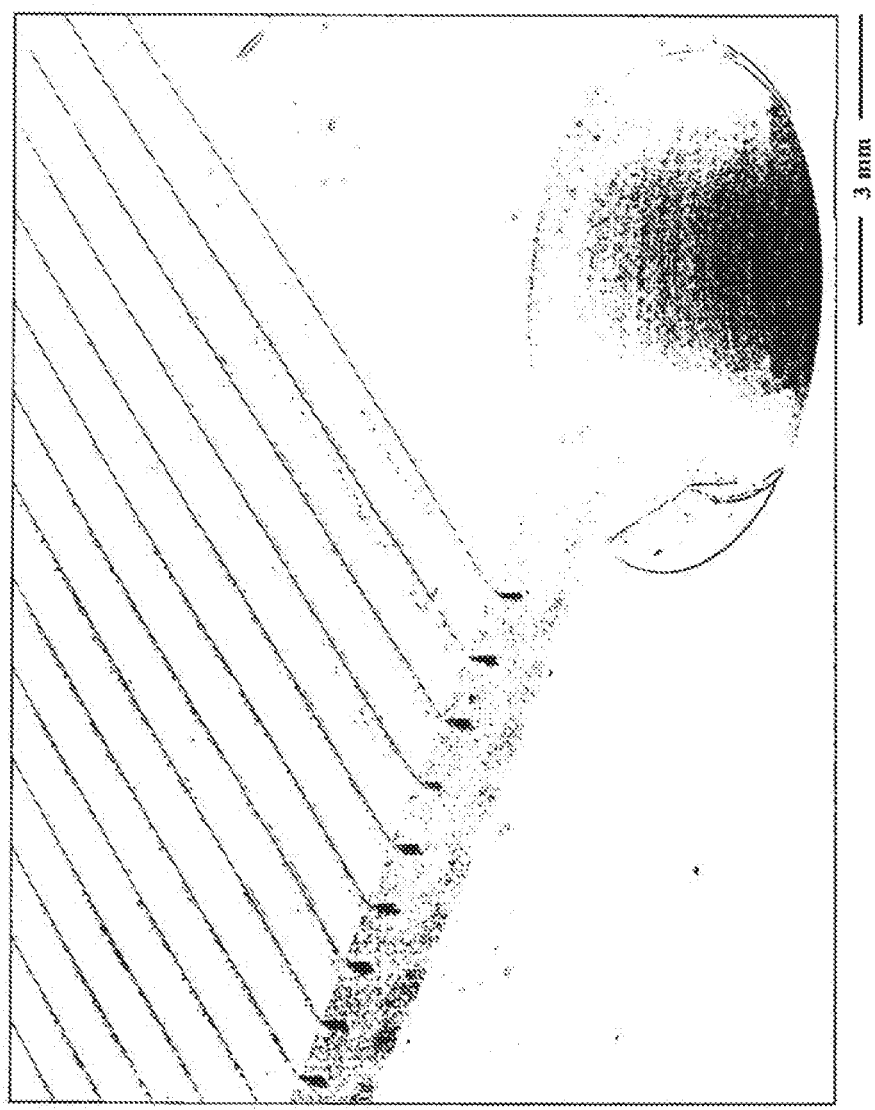
FIG. 20 depicts a detailed view of a transition from a microchannel array to a fluid supply channel formed by a single cut with µEDM.

Example 12: Creating Microchannel-To-Large-Plenum Fluidic Transitions by Non-Contact Machining Methods FIGS. 19 and 20 depict an example of multiple-microchannels-to-large-plenum fluidic transitions created in Cu by µEDM. An array of straight microchannels created by molding replication was connected to one supply channel and to one drain plenum using µEDM. Flat stainless steel sheets with a thickness of 1100 µm were used as blade electrodes for µEDM. A single cut with the steel blade electrode formed the fluid supply channel, while six consecutive cuts with partial overlaps formed the fluid drain plenum. All cuts were perpendicular to the microchannel array. The depth of the cuts was the same for all cuts on both the supply and drain sides.

As shown in FIG. 19 for one Cu coupon, mechanical drilling was used to make two through holes to connect to the supply channel, and three through holes within the drain plenum. The through holes in the drain plenum were placed symmetrically with respect to the microchannel array. All through holes were mechanically tapped from the coupon's far side, away from the microchannel array, to allow external fluid connections using plastic adapters. The 6.4 mm coupon thickness sufficed to accommodate the taps. FIG. 20 provides a more detailed view of the fluidic supply connections on the Cu coupon from one tapped hole to the microchannels. The supply channels had the mottled surface morphology typical of structures cut by µEDM. The entrances were unobstructed.

Alternatively, the microchannel-to-plenum transitions shown in FIGS. 19 and 20 can be formed by molding with an appropriate insert geometry design.

Improving Heat Exchange Efficiency with Metal-Based Microchannels Having Substantial Surface Roughness A further aspect of the invention pertains to the creation of microchannel heat exchangers with engineered surface roughness within the microchannels. Surprisingly, we found that surface roughness within microchannels, for example on the order of a few microns to several tens of microns, substantially increases convective heat transfer performance of the entire device as compared to an otherwise similar device with smoother surfaces, i.e., one having a roughness less than a few microns. We further found that molding techniques are well adapted to replicate such surface roughness in metal-based microchannels. For example, the surface roughness of the refractory metal or alloy mold insert can be altered through the µEDM and ECP process control, for example by controlling the current density or etch time. Such surface roughness on the mold insert is conveyed with high fidelity through the molding process onto the metal substrate being molded. By contrast, such surface roughness would usually not be seen in microchannel structures made by conventional "semiconductor/IC-type" processing methods. With the novel molding replication technique, reproducible roughness within metal-based microchannels becomes fast and inexpensive.

We have discovered, quite unexpectedly, that this surface roughness substantially enhances microchannel heat exchanger performance. Our data suggested that surface roughness within the microchannels promotes fluid flow mixing to a surprising degree, which consequently increases the convective heat transfer coefficient as compared to similar microchannels with smooth surfaces. Such heat transfer enhancements exist over a large range of flow rates or Reynolds numbers.

Figure 21:
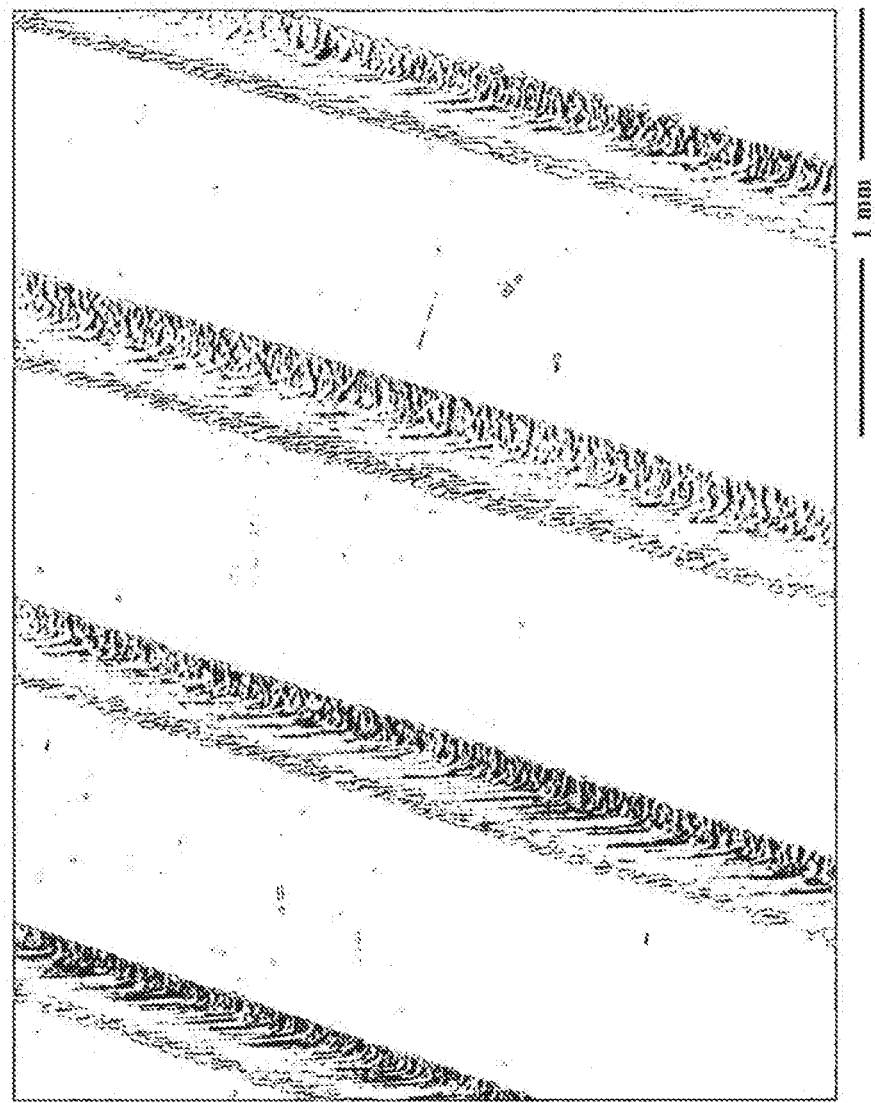
FIG. 21 depicts a detailed view of a typical Cu-based microchannel array fabricated by molding replication.

Examples 13 and 14: Enhancing Heat Transfer Performance in Cu- and Al-Based, Single-Layer, Microchannel Devices with Increased Surface Roughness We prepared bonded Cu and Al microchannel devices, and attached polymer external fluid adaptors. (Not shown; see FIG. 26 of priority application 61/020,789.) The internal microchannel array configurations within these devices was the same as that shown in FIGS. 19 and 20. FIG. 21 depicts a high-magnification scanning electron micrograph of a portion of the replicated Cu microchannel array. The Cu microchannels have vertical sidewalls and sharp sidewallto-bottom transitions. Elevated surface roughness is clearly visible on the sidewall and bottom of all microchannels. Generally similar observations were made in the Al microchannel device (data not shown).

The surface roughness within the molded microchannels was quantitatively evaluated by optical profilometry, expressed as peak-to-valley roughness Rz. The average Rz values were 11.8 µm and 8.2 µm for the bottom surfaces of Cu and Al microchannels, respectively. Surface roughness of the microchannel sidewalls was somewhat smaller, on the order of 5 µm. The observed Rz values, on the order of 10 µm, substantially exceeded what is typically obtained from micromilling (typically 1 µm or less).

We compared our measured heat transfer rates with some that have been reported in the literature. (Data not shown; see FIG. 28 of priority application 61/020,789.) Measured heat transfer coefficients, h, were converted to dimensionless Nusselt numbers, Nu, based on the average hydraulic diameter of the microchannels, $D_h$, $$Nu = \frac{hD_h}{K_f},$$

where $K_f$ is the thermal conductivity of the fluid. Values of Nu are plotted versus the Reynolds number, Re, which represents a dimensionless average fluid velocity through the microchannels, $\overline{V}$. The value of Re is defined as $$Re = \frac{\rho \overline{V} D_h}{\mu}.$$

Both the fluid density $\rho$ and the viscosity $\mu$ (in this case for liquid water) may depend on temperature.

In the range 500<Re<2250, good agreement existed between Nusselt numbers measured from the Cu and the Al MHE specimens. For Re>2500, data from the Cu and the Al MHE specimens began to diverge, with Nu values from the Cu specimen exceeding those from the Al specimen.

We compared our measurements to data taken from Lee et al., *Int. J. Heat Mass Transfer* 48(9), 1688-1704 (2005) for machined Cu microchannels with smooth surfaces; the data set of Lee et al. were taken from microchannels with $D_h$=318 µm, and extended over a smaller range of Re, from ~500 to ~2500. Our measured Nu values were substantially and significantly higher than those of Lee et al. over much of the range 500<Re<2500. We also compared our measured values to some conventional Nusselt number correlations. Correlations for fully developed laminar flow and the Sieder-Tate correlation for simultaneously developing laminar flow were calculated using dimensions corresponding to the Cu microchannel device. The Gnielinski correlation for transitional and fully developed turbulent flows was also calculated. Our data from the novel Cu and Al microchannel devices exhibited trends generally similar to those predicted by the conventional correlations, but with higher values of Nu. (Data not shown; see FIG. 28 of priority application 61/020,789.)

The data obtained from the Cu and Al microchannel devices, as well as the data of Lee et al., showed Nusselt number increasing with increasing Reynolds number. At the same Re values, our data showed higher Nu values as compared to those of Lee et al. Direct visualization of flow within the microchannel arrays would be impractical for the assembled, opaque Cu and Al microchannel devices. Nonetheless, it appears that the surface roughness within the microchannel arrays resulting from the molding replication process is responsible for the observed higher Nu values. The increased surface roughness within the microchannel arrays may, for example, lead to increased cross-wise flow mixing, resulting in higher heat transfer as compared to that in smoother channels.

Accurate measurements of the solid-to-fluid heat transfer rate require an accurate estimate of the solid wall temperature of the microchannel array. Relatively large temperature gradients can be induced within the body of the metal-based MHEs during constant heat flux testing, making the estimate of solid wall temperature less reliable. Therefore, an alternative, constant solid surface temperature testing configuration was adopted to measure heat transfer rates more accurately. Higher Nu values were obtained as compared to the uncorrected results, approaching 40 at Re of ~3000. The maximum uncertainty for Nu values was ~16%.

We compared known Nusselt number correlations to our experimental data. The experimental Nu values significantly exceeded the Hausen and Sieder-Tate correlation values at 250<Re<1500.

For turbulent flow, the Dittus-Boelter correlation and the Petukhov correlation were used in the Reynolds number range 2000<Re<3000. These two correlations yielded nearly identical Nu values over this Reynolds number range. Our measured Nu values substantially exceeded the Dittus-Boelter and Petukhov correlation values. When corrections were made to account for a surface roughness of ~5 µm, the correlations better matched the observed Nu data. These trends illustrate the need to consider surface roughness and entrance length effects in analyzing flow and heat transfer data, and further demonstrate that engineering surface roughness into microchannel surfaces can be an effective means to increase heat transfer efficiency.

Figure 22:
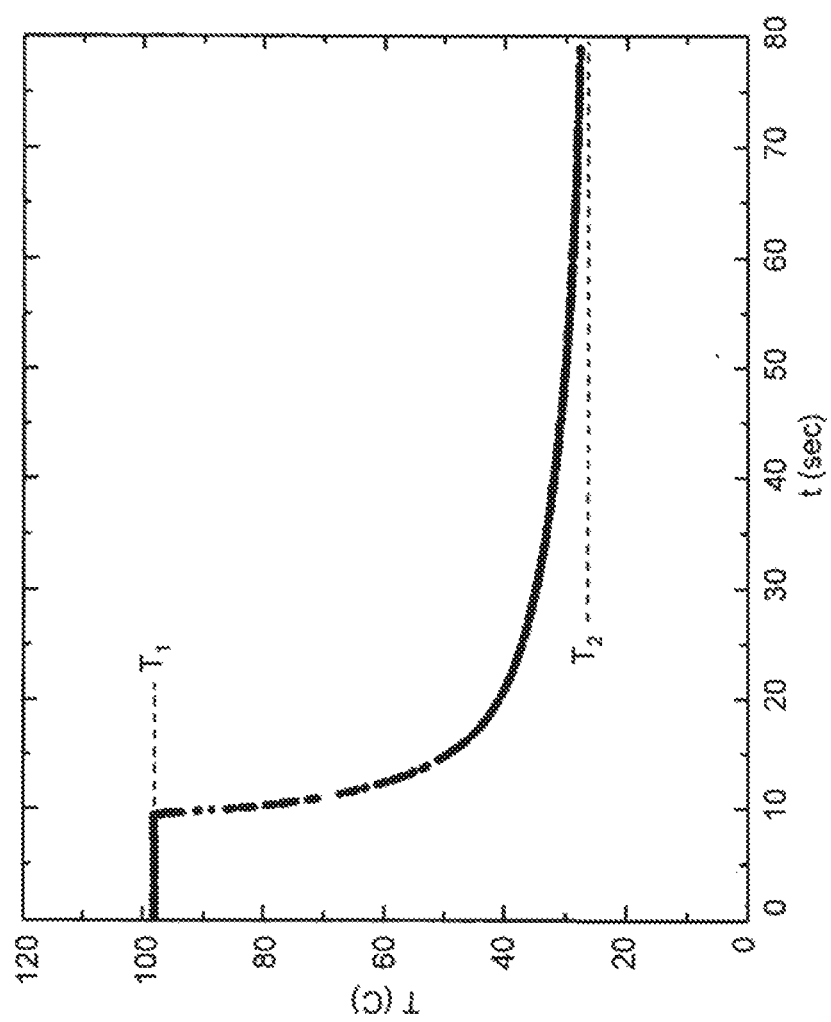
FIG. 22 depicts Cu device surface temperature versus time as water flowed through the microchannel array.
Figure 23:
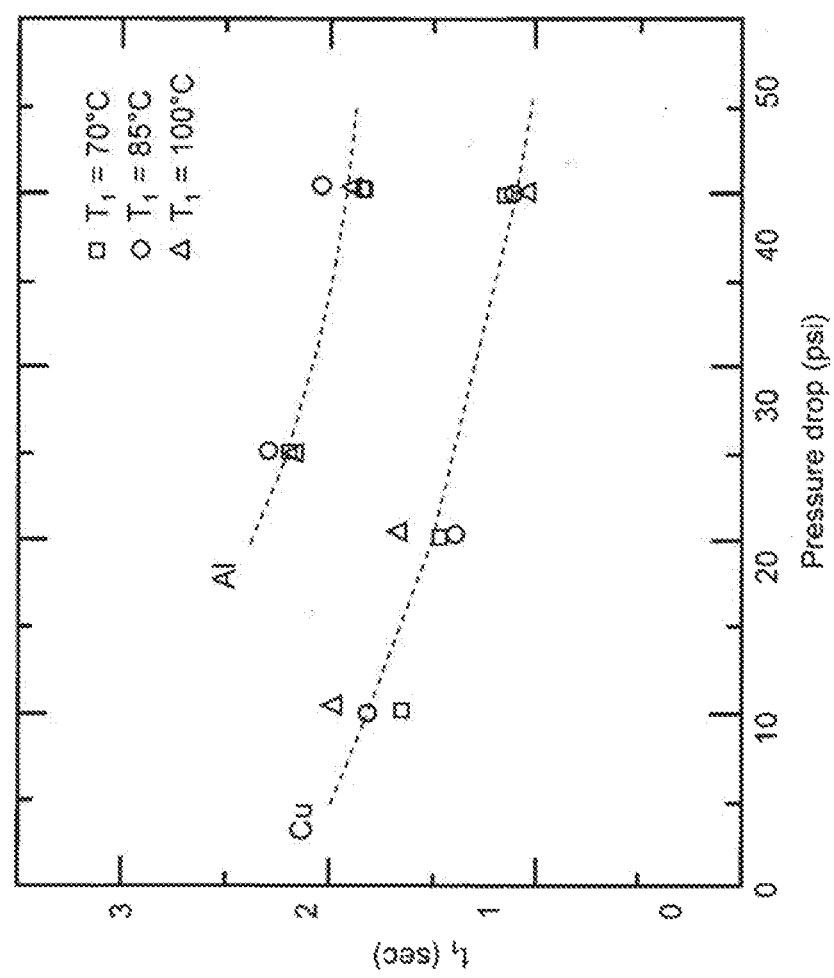
FIG. 23 depicts the fast time constants associated with surface temperature drop for Cu and Al microchannel devices.

The usefulness of heat transfer devices in accordance with the present invention is illustrated in FIG. 22. Initially, heaters attached to the prototype Cu microchannel device were turned on and the device was allowed to reach a temperature of about 100° C. Keeping the same power input, about 20 W, in the heaters, room temperature water (~28° C.) was suddenly introduced into the Cu microchannel device with a fixed pressure drop ΔP from the outlet to the inlet. The device's surface temperature was monitored in real time using an infrared (IR) camera. FIG. 22 shows the change in surface temperature of the Cu microchannel device as a function of time, both before and after introduction of water into the specimen at time t=10 sec. The surface temperature dropped more than 50° C. within the first 5 seconds, followed by a more gradual decrease to ~30° C. over the next 60 seconds. The initial, faster drop in temperature was attributed to drawing heat from the Cu. The second and more gradual drop in temperature was attributed to drawing heat from the surrounding insulation material. A fit was made of the measured surface temperature versus time, assuming a compound exponential decay with two distinct time constants $\tau_1$ and $\tau_2$. Consistent with expectation, $\tau_1$ was on the order of a few seconds while $\tau_2$ was on the order of a few tens of seconds. FIG. 23 shows values of the fitted time constant $\tau_1$ for both the Cu and Al microchannel devices, obtained at different values of ΔP and initial specimen temperature $T_1$. As $T_1$ varied from 70 to 100° C., the values of $\tau_1$ showed little variation. However, $\tau_1$ decreased with increasing ΔP or water flow rate. $\tau_1$ was in the range of 1 to 2 s for the Cu device, and 2 to 2.5 s for the Al device. This very rapid cooling demonstrated the advantages of incorporating high thermal conductivity metals, such as Cu and Al, into heat exchangers.

Example 15: Two-Layer, Cu-Based, Microchannel Devices Incorporating Heating Cartridges: Instant Water Heater Prototype A process generally similar to that described above was used to manufacture Cu-based, two-layer microchannel, "instant" water heater prototypes. Cu blocks containing holes for accommodating cylindrical, electric cartridge heaters, and holes/plena for fluidic connections were made by conventional machining. Arrays of parallel microchannels were replicated in Cu coupons by molding. Surfaces of Cu blocks and coupons were polished with 1200-grit silicon carbide papers prior to bonding. The prototype assembly comprised one such Cu block placed between two Cu coupons, each containing a parallel array of replicated microchannels. One 10 μm-thick, free-standing Al thin film was inserted at each coupon/block interface. The entire coupon/block/coupon assembly was placed on top of the bottom heating station. After evacuation, both heating stations were heated above 500° C., and the upper heating station was placed in contact with the assembly. An increasing compression force was applied to the assembly at a constant loading rate of 300 N/min. The force was held constant for 15 min once the compression force reached ~3000 N, corresponding to an average applied pressure of ~3 MPa. The final bonding temperature for the coupon/block/coupon assemblies was held at ~580° C. After the constant force hold, the linear actuator was withdrawn from the assembly and the system was cooled down.

Figure 24:
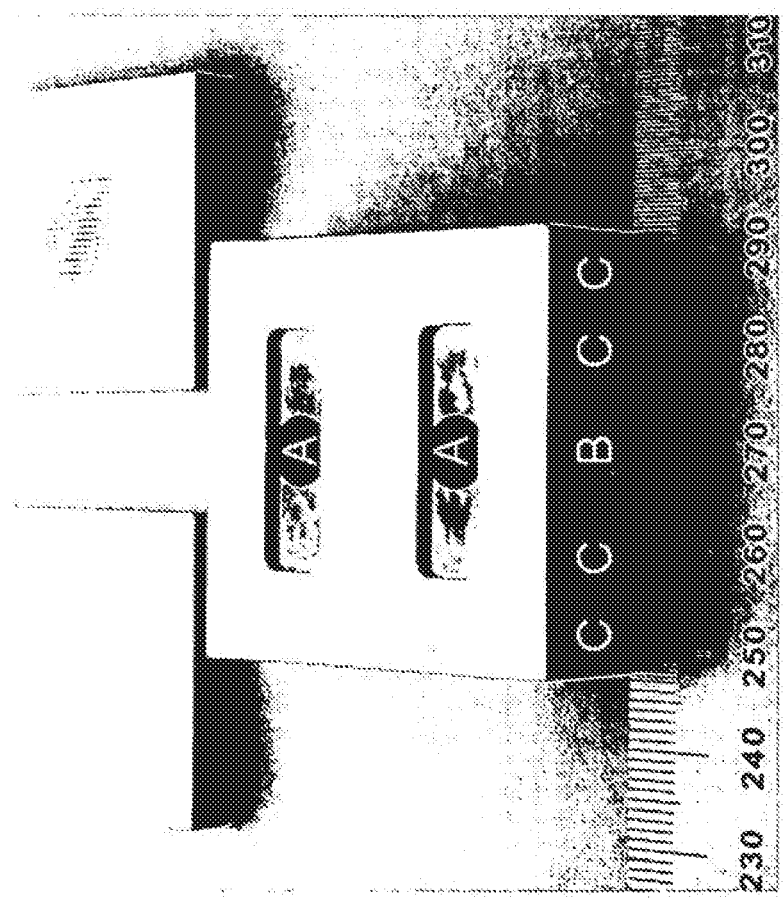
FIG. 24 depicts a pre-assembly, two-layer, Cu-based, instant water heater prototype. Numbers shown on the ruler in the foreground are in mm.

A photograph of a breakdown of a prototype instant water heater assembly is shown in FIG. 24. There were two Cu coupons, each containing one set of parallel rectangular microchannels ~15 mm long, ~150 μm wide, ~400 μm deep, covering a total area of ~15 mm×15 mm, together with a custom-made Cu heater block with overall dimensions of 43 mm×43 mm×15 mm. On the top heater block surface, two plena were machined to connect to the two ends of the microchannel array on the Cu coupon. The distance between the two plena was ~12.8 mm. The bottom heater block surface had an identical configuration (not visible in FIG. 24). A hole in each plenum, ~7.5 mm diameter (labeled "A" in FIG. 24), was machined through the entire heater block to connect the two plena on the top and bottom heater block surfaces. An additional hole on each side of the heater block was machined perpendicular to hole A (labeled B in FIG. 24), for external water connections. Four parallel holes (labeled C in FIG. 24), each with a diameter ~6.4 mm and a length ~41 mm, were drilled parallel to hole B, and were used to house four cylindrical cartridge, 180 W, electrical-resistance heaters.

A testing apparatus was designed and built to evaluate the heat transfer characteristics of assembled Cu instant water heater prototype. The apparatus comprised three principal sections: water supply section, test section, and data acquisition section. The water supply section comprised a pressure-regulated water storage tank, which supplied water to the specimen at a constant pressure for a smooth and stable flow through the microchannels at low flow rates. A valve downstream of the tank exit was used for fine adjustments to the flow rate. An Instrunet data acquisition system interfaced to a PC was used to collect thermocouple readings.

Water flow through the assembled Cu instant water heater prototype, and heat transfer from the cartridge heaters to water were measured. The total pressure drop across the inlet and exit fluid connections was measured with a Dywer digital manometer with a minimum reading of 690 Pa (~0.1 psi). The rates of water flow through the microchannel arrays in the prototype were measured as a function of the associated pressure drop. The flow rate increased monotonically with increasing pressure drop across the prototype, and reached 1.5 liter/min at a pressure drop of ~0.48 MPa (~70 psi).

Figure 25:
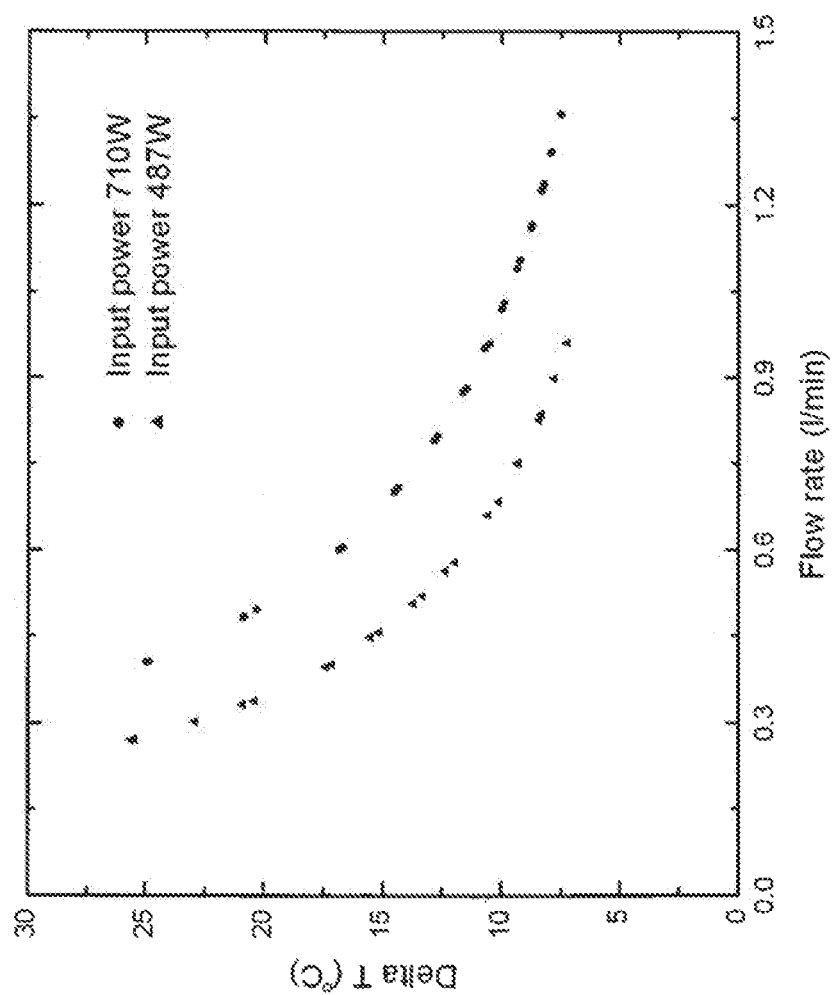
FIG. 25 depicts the difference in water temperature between the outlet and inlet of the Cu instant water heater prototype as a function of the water flow rate.
Figure 26:
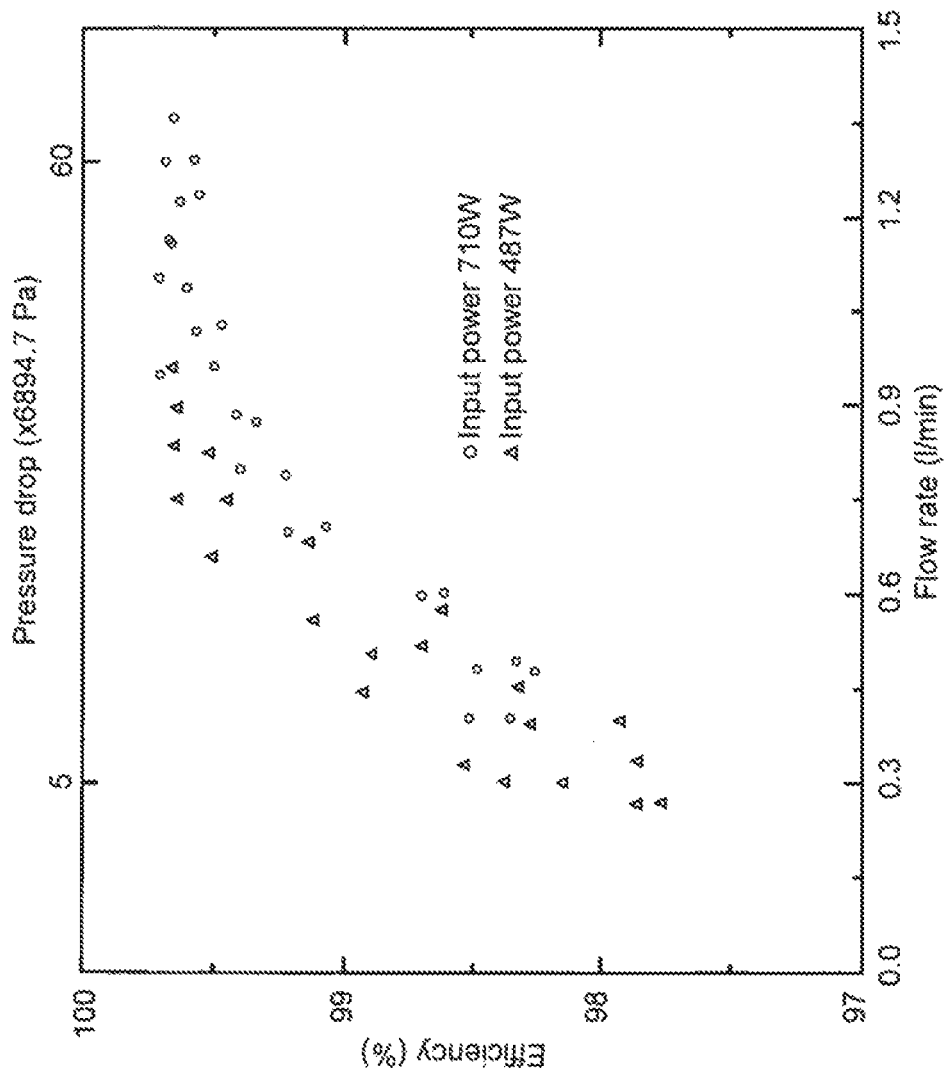
FIG. 26 depicts overall heat transfer efficiency of the Cu instant water heater prototype as a function of the water flow rate.

Thermocouples were inserted into both the inlet and outlet tubes with T-fittings, and were sealed with epoxy cement. Additional thermocouples were placed on the top and bottom surfaces of the prototype, as well as on the side surface closest to the heaters. Because none of the thermocouples were placed within the microchannels, whether the water flow within the microchannels is laminar or turbulent should not affect the temperature measurements. The entire assembly was then encased within PVC insulation, with holes drilled into the PVC to allow for the fluid inlet, outlet, and pressure meter tube connections. FIG. 25 depicts the (outlet-inlet) difference in water temperature as a function of water flow rate through the prototype, measured at two different heater input powers. At the higher input power of ~710 W, the water temperature increased >7° C. at a flow rate of ~1.4 liter/min and >25° C. at a flow rate of ~0.4 liter/min. The efficiency of heat transfer, defined as the ratio of power gained by water to total heater input power, is shown in FIG. 26 as a function of the water flow rate. The efficiency was very high in all cases, ranging from just under 98%, to a maximum of 99.7% at higher flow rates. At higher flow rates, the lower prototype body temperature resulted in lower heat loss to the PVC insulation and therefore higher overall heat transfer efficiency.

Miscellaneous

Those of skill in the art will recognize that various modifications may be made to the embodiments described above, while staying within the scope of the present inventions. Among the possible modifications and alternative embodiments are those described above and below.

A metal-based microchannel heat exchange device may be formed of a variety of metals, including aluminum, aluminum-based alloys, copper, copper-based alloys, nickel, or nickel-based alloys, such as nickel-titanium alloys.

The microchannel arrays may be straight, curved, or profiled, in any or all dimensions.

The microchannel arrays may be formed from multiple metal sheets, with multiple bonding interfaces, or multiple connections from microchannel arrays to fluid inlet and outlet plena. The microchannels preferably have elevated surface roughness to improve heat exchange, for example in the range about 1 μm≤Rz≤20 μm, preferably the range about 3 μm≤Rz≤15 μm, most preferably about 10 μm. The insert surface roughness may be controlled, for example, by altering electrochemical polishing conditions.

The microchannel arrays are preferably made by microscale compression molding using a microscale mold insert made of a refractory metal or alloy. Among the materials that may be used for the refractory mold insert are the following: Ta, W, Mo, Nb; their respective binary, ternary, and quaternary alloys, with or without metalloid element additions such as C, B, Si; transition metals and alloys, such as Hf, Zr, Ti, V, Cr; their respective binary, ternary, and quaternary alloys, with or without metalloid element additions such as C, B, Si; all classes of Fe-based tool steels, including M-series, T-series, and H-series tool steels; a Ni-based alloy or superalloy, for example one of the Inconel series of Ni alloys; or a refractory ceramic, including a metal carbide such as TaC, WC, MoC, TiC, NbC, pseudo-binary alloys of metal carbides, such as TaC—WC, or a metal nitride such as TaN, WN, MoN, TiN, NbN, or pseudo-binary alloys of metal nitrides, such as TaN—WN; or diamond. The inserts may be made, for example, by electrical discharge machining, or by micro-electrical discharge machining using lithographically patterned electrodes. The inserts may optionally be conformally coated with a suitable ceramic, carbon, or hydrocarbon coating.

The bonding interfaces may occur between metal sheets containing microchannel arrays, or between metal sheets containing microchannel arrays and solid plates, or between metal sheets containing microchannel arrays and perforated plates. The thin film intermediate bonding layer may itself have a eutectic or near-eutectic composition; or it may be a eutectic precursor that will form a eutectic or near-eutectic composition when heated in contact with the adjacent metal piece(s). The intermediate bonding layer may, for example, comprise a free-standing thin film (eutectic precursors), e.g., Cu, Zn, Al, Mg, Sn, Ga, In, or Ni; or it may comprise a eutectic or near-eutectic nanocomposite layer, e.g., Al—Ge, Al—Si, Al—Mg, Al—Sn, Al—Ga, Au—Si, Cu—Al, Al—Zn, Sn—In, Cu—In, Au—In, Ag—In, Ag—Sn, Cr—Sn, Cu—Sn, Au—Sn, and binary, ternary, or quaternary mixtures of any of the above. The individual domains within the eutectic bonding layer are preferably primarily in the range from about 100 nm or smaller to about 400 nm. Alternatively, a free standing thin metal film may be used as a eutectic precursor, including for example Al, Sn, Zn, Cu, Ni, or their alloys. The individual bonding layer thickness is preferably from about 0.3 to about 10 µm. The thin film eutectic or near-eutectic bonding layer may, for example be fabricated by direct physical or chemical vapor phase deposition onto the pieces to be bonded; or a free-standing thin film may be fabricated by metallurgical means and inserted between the pieces to be bonded; or other techniques otherwise known in the art may be used, such as sputter deposition or co-deposition, co-evaporation, or e-beam co-evaporation. The pieces are heated to an appropriate temperature to ensure proper quality of bonding, without excessive deformation, by heating to a temperature at or just above the eutectic point; for example from about 450° C. to about 550° C. in the case of aluminum or aluminum-containing alloys, or from about 500° C. to about 600° C. in the case of copper or copper-containing alloys. Preferably pressure is applied during the heating step to promote bonding between the thin film layer and the metal workpiece, for example, from about 0.5 to about 5 MPa, or higher.

Among the materials that may be used for the low-melting metal to form the heat exchanger are the following: Aluminum and aluminum-based alloys, such as the 1xxx series of Al alloys, 2xxx series of Al alloys, 3xxx series of Al alloys, 5xxx series of Al alloys, 6xxx series of Al alloys, and 7xxx series of Al alloys; Copper and copper-based alloys, e.g. the C1xxxx series of Cu alloys, C2xxxx series of Cu alloys, C5xxxx series of Cu alloys, and C7xxxx series of Cu alloys; Nickel and nickel-based alloys, e.g. Ni—Ti alloys, Ni—Cu alloys, Ni—Al alloys; Zinc and zinc-based alloys; and Magnesium and magnesium-based alloys.

Preferred ranges for various dimensions and other numerical values in novel heat exchangers in accordance with the present invention are: (a) Microchannel length: from about 100 µm upwards (no upper limit in length; for example, a meandering channel could be several meters in total length). (b) Microchannel width: from about 30 µm minimum to about 2000 µm, preferably from about 30 µm to about 1000 µm. (c) Microchannel depth: from about 30 µm to about 2000 µm, preferably from about 30 µm to about 1000 µm. (d) Microchannel cross-sectional aspect ratio: from about 0.03 to about 35. (e) Number of microchannels in heat exchanger: from 1 (e.g., one long meandering channel) to 1000 or 10,000 (e.g., a total device width of about one meter). (f) Overall dimensions of metal-based heat exchangers: from about 5 mm×5 mm×1.5 mm (e.g., a one-microchannel-layer device for cooling a single "hot-spot"); to about 1000 mm×100 mm×100 mm (e.g., a multiple-microchannel-layer device).

Definitions. The "length" of a microchannel is defined as its total distance measured along the direction in which fluid will generally tend to flow through the microchannel, measured along the path of that fluid flow. The "width" and "depth" of a microchannel are distances measured perpendicular (or approximately perpendicular) both to each other and to the length of the microchannel. There is no preferred direction defined as "width," nor as "depth," but each may be taken in a convenient direction, consistent with the preceding definitions. The use of the terms "length," "width," and "depth" should not be construed to imply that the microchannel must assume any particular shape. As a few of many possible examples, a cross-section of a microchannel may be square, circular, rectangular, or elliptical; and the microchannel itself may be straight, curved, spiral, sinusoidal, serpentine, a racetrack, etc. A "homogeneous" metal layer or metal component is one that is essentially uniform throughout, except perhaps at a surface or boundary where it may be brazed or joined to another layer or component. More specifically, a component that contains separate, multiple, internal layers of metal interspersed (or brazed together) with separate, multiple, internal eutectic layers is not considered to be "homogeneous" within the scope of this definition. Different "homogenous" components in the same device need not necessarily have the same composition, although in many cases it will be preferred that their compositions should be the same. A microchannel is considered to be "enclosed entirely" by specified components (such as by two homogeneous metal layers and a eutectic layer) if it is enclosed and bounded by the specified components—and by no other components—along essentially the entire length of the microchannel; with possible exceptions at (and only at) the microchannel's fluid inlet(s) and fluid outlet(s). At the inlet(s) and outlet(s), the microchannel may optionally be open rather than closed; and at the inlet(s) and outlet(s) the microchannel may optionally connect to or be bounded by other component(s).

The complete disclosures of all references cited in this specification are hereby incorporated by reference; including, by way of example and not limitation, the entire disclosure of priority U.S. provisional application 61/020,789, filed 14 Jan. 2008. In the event of an otherwise irreconcilable conflict, however, the present specification shall control.

What is claimed:

1. A process for making a metal microchannel heat exchanger, the process comprising:
   forming one or more open microchannels on a surface of a first homogeneous metal piece, wherein at least one of the one or more open microchannels has a width between about 30 µm and about 1000 µm, and a depth between about 30 µm and about 1000 µm;
   providing a second homogeneous metal piece that, when bonded to the first homogeneous metal piece, will convert one or more open microchannels on the first homogeneous metal piece into one or more closed microchannels, wherein the one or more closed microchannels are adapted to transport liquid without substantial leakage;

providing a eutectic layer or a eutectic precursor layer at one or more of the following locations: a surface of the first homogeneous metal piece, a surface of the second homogeneous metal piece, or between the first and second homogeneous metal pieces;

simultaneously applying pressure to and heating the first and second homogeneous metal pieces, wherein:

the pressure pushes the first and second homogeneous metal pieces toward each other, with the eutectic layer or the eutectic precursor layer between the first and second homogeneous metal pieces;

the first and second homogeneous metal pieces are heated to a eutectic melting temperature at which the eutectic layer or the eutectic precursor layer melts, or at which the eutectic layer or the eutectic precursor layer interacts with the first and second homogeneous metal pieces to form a molten eutectic composition between the first and second homogeneous metal pieces; and the eutectic melting temperature to which the first and second homogeneous metal pieces are heated is sufficiently below a melting temperature of the first and second homogeneous metal pieces that no substantial deformation of the one or more open microchannels occurs;

cooling the first and second homogeneous metal pieces to a cooling temperature substantially below the eutectic melting temperature, while maintaining the pressure during at least a portion of the cooling; such that the first and second homogeneous metal pieces fuse together;

such that the one or more open microchannels are converted into one or more closed microchannels, wherein the one or more closed microchannels are adapted to transport liquid without substantial leakage; and wherein no substantial blockage of the one or more closed microchannels occurs as a result of the heating, applying pressure, and cooling;

and wherein:

the one or more closed microchannels are enclosed entirely by the fused first and second homogeneous metal pieces and the eutectic layer or the eutectic precursor layer; and whereby the fused first and second homogeneous pieces and the eutectic layer or the eutectic precursor layer, together with the enclosed one or more closed microchannels, form a microchannel heat exchanger; and wherein at least one of the closed microchannels has a surface roughness between about 3 µm and about 15 µm.

2. The process of claim 1, wherein the microchannel heat exchanger is capable of withstanding an internal pressure in the one or more closed microchannels of 100 atmospheres or greater.

3. The process of claim 1, wherein forming the one or more open microchannels on the surface of the first homogeneous metal piece comprises compression molding of the first homogeneous metal piece with a refractory metal mold insert.

4. The of claim 1, wherein the one or more closed microchannels discharge into a fluid drain plenum.

5. The process of claim 1, wherein the eutectic layer or the eutectic precursor layer comprises a eutectic nanocomposite thin film.

6. The process of claim 5, wherein a domain size of the eutectic nanocomposite thin film is in a range from about 100 nm to about 400 nm.

7. The process of claim 5, wherein flux-free bonding of the first and second homogeneous metal pieces is achieved using the eutectic nanocomposite thin film.

8. The process of claim 1, further comprising forming one or more open microchannels on a surface of the second homogeneous metal piece prior to simultaneously applying pressure to and heating the first homogeneous metal piece and the second homogeneous metal piece.

9. The process of claim 1, wherein the first homogeneous metal piece and the second homogeneous metal piece are dissimilar metals.

10. A metal microchannel heat exchanger, wherein the metal microchannel heat exchanger is produced by a process comprising:

forming one or more open microchannels on a surface of a first homogeneous metal piece, wherein at least one of the one or more open microchannels has a width between about 30 µm and about 1000 µm, and a depth between about 30 µm and about 1000 µm;

providing a second homogeneous metal piece that, when bonded to the first homogeneous metal piece, will convert one or more open microchannels on the first homogeneous metal piece into one or more closed microchannels, wherein the one or more closed microchannels are adapted to transport liquid without substantial leakage;

providing a eutectic layer or a eutectic precursor layer at one or more of the following locations: a surface of the first homogeneous metal piece, a surface of the second homogeneous metal piece, or between the first and second homogeneous metal pieces;

simultaneously applying pressure to and heating the first and second homogeneous metal pieces, wherein: the pressure pushes the first and second homogeneous metal pieces toward each other, with the eutectic layer or eutectic precursor layer between the first and second homogeneous metal pieces; the first and second homogeneous metal pieces are heated to a eutectic melting temperature at which the eutectic layer or the eutectic precursor layer melts, or at which the eutectic layer or the eutectic precursor layer interacts with the first and second homogeneous metal pieces to form a molten eutectic composition between the first and second homogeneous metal pieces; and the eutectic melting temperature to which the first and second homogeneous metal pieces are heated is sufficiently below a melting temperature of the first and second homogeneous metal pieces that no substantial deformation of the one or more open microchannels occurs;

cooling the first and second homogeneous metal pieces to a cooling temperature substantially below the eutectic melting temperature, while maintaining the pressure during at least a portion of the cooling; such that the first and second homogeneous metal pieces fuse together; such that the one or more open microchannels are converted into one or more closed microchannels, wherein the one or more closed microchannels are adapted to transport liquid without substantial leakage; and wherein no substantial blockage of the one or more closed microchannels occurs as a result of the heating, applying pressure, and cooling;

and wherein:

the one or more closed microchannels are enclosed entirely by the fused first and second homogeneous metal pieces and the eutectic layer or the eutectic precursor layer; and whereby the fused first and second homogeneous pieces and the eutectic layer or the eutectic precursor layer, together with the enclosed one or more closed microchannels, form a microchannel heat exchanger;

wherein the one or more closed microchannels discharge into a fluid drain plenum; and wherein the one or more closed microchannels comprise at least one microchannel that discharges into the fluid drain plenum via a fluidic transition that widens outward from an end of the at least one microchannel.

11. The metal microchannel heat exchanger of claim 10, wherein the first and second homogeneous metal pieces are brazed to one another by the eutectic layer.

12. The metal microchannel heat exchanger of claim 10, wherein the one or more closed microchannels comprise a plurality of substantially parallel microchannels.

13. The metal microchannel heat exchanger of claim 12, wherein the plurality of substantially parallel microchannels as supplied by a common fluid supply channel.

14. The metal microchannel heat exchanger of claim 10, wherein the one or more closed microchannels comprise a meandering microchannel.

15. A process for making a metal microchannel heat exchanger, the process comprising:

forming one or more open microchannels on a surface of a first homogeneous metal piece, wherein at least one of the one or more open microchannels has a width between about 30 μm and about 1000 μm, and a depth between about 30 μm and about 1000 μm;

providing a second homogeneous metal piece that, when bonded to the first homogeneous metal piece, will convert one or more open microchannels on the first homogeneous metal piece into one or more closed microchannels, wherein the one or more closed microchannels are adapted to transport liquid without substantial leakage;

providing a eutectic layer or a eutectic precursor layer at one or more of the following locations: a surface of the first homogeneous metal piece, a surface of the second homogeneous metal piece, or between the first and second homogeneous metal pieces;

simultaneously applying pressure to and heating the first and second homogeneous metal pieces, wherein:

the pressure pushes the first and second homogeneous metal pieces toward each other, with the eutectic layer or the eutectic precursor layer between the first and second homogeneous metal pieces;

the first and second homogeneous metal pieces are heated to a eutectic melting temperature at which the eutectic layer or the eutectic precursor layer melts, or at which the eutectic layer or the eutectic precursor layer interacts with the first and second homogeneous metal pieces to form a molten eutectic composition between the first and second homogeneous metal pieces; and the eutectic melting temperature to which the first and second homogeneous metal pieces are heated is sufficiently below a melting temperature of the first and second homogeneous metal pieces that no substantial deformation of the one or more open microchannels occurs;

cooling the first and second homogeneous metal pieces to a cooling temperature substantially below the eutectic melting temperature, while maintaining the pressure during at least a portion of the cooling; such that the first and second homogeneous metal pieces fuse together;

such that the one or more open microchannels are converted into one or more closed microchannels, wherein the one or more closed microchannels are adapted to transport liquid without substantial leakage; and wherein no substantial blockage of the one or more closed microchannels occurs as a result of the heating, applying pressure, and cooling;

and wherein:

the one or more closed microchannels are enclosed entirely by the fused first and second homogeneous metal pieces and the eutectic layer or the eutectic precursor layer; and whereby the fused first and second homogeneous metal pieces and the eutectic layer or the eutectic precursor layer, together with the enclosed one or more closed microchannels, form a microchannel heat exchanger; and wherein forming the one or more open microchannels on the surface of the first homogeneous metal piece comprises compression molding of the first homogeneous metal piece with a refractory metal mold insert; and wherein the refractory metal mold insert is fabricated to impart surface roughness in the one or more open microchannels formed on the surface of the first homogeneous metal piece, the surface roughness being 5 μm or higher, measured as mean peak-to-valley roughness.

16. The process of claim 15, further comprising forming one or more open microchannels on a surface of the second homogeneous metal piece prior to simultaneously applying pressure to and heating the first homogeneous metal piece and the second homogeneous metal piece.

17. The process of claim 15, wherein the first homogeneous metal piece and the second homogeneous metal piece are dissimilar metals.

18. The process of claim 15, wherein the eutectic layer or the eutectic precursor layer comprises a eutectic nanocomposite thin film.

19. The process of claim 18, wherein a domain size of the eutectic nanocomposite thin film is in a range from about 100 nm to about 400 nm.

20. The process of claim 18, wherein flux-free bonding of the first and second homogeneous metal pieces is achieved using the eutectic nanocomposite thin film.

* * * * *